United States Patent
Chen et al.

(10) Patent No.: US 11,139,226 B2
(45) Date of Patent: Oct. 5, 2021

(54) SEMICONDUCTOR PACKAGE STRUCTURE AND ASSEMBLY STRUCTURE

(71) Applicant: Advanced Semiconductor Engineering, Inc., Kaohsiung (TW)

(72) Inventors: Hsin-En Chen, Kaohsiung (TW); Ian Hu, Kaohsiung (TW); Hung-Hsien Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/579,345

(22) Filed: Sep. 23, 2019

(65) Prior Publication Data

US 2020/0111728 A1 Apr. 9, 2020

Related U.S. Application Data

(60) Provisional application No. 62/742,239, filed on Oct. 5, 2018.

(51) Int. Cl.
| | |
|---|---|
| *H01L 23/46* | (2006.01) |
| *H01L 23/495* | (2006.01) |
| *H01L 23/367* | (2006.01) |
| *H01L 23/31* | (2006.01) |
| *H01L 23/473* | (2006.01) |
| *H01L 23/427* | (2006.01) |

(52) U.S. Cl.
CPC .... *H01L 23/49568* (2013.01); *H01L 23/3157* (2013.01); *H01L 23/367* (2013.01); *H01L 23/427* (2013.01); *H01L 23/473* (2013.01); *H01L 23/4952* (2013.01); *H01L 23/49548* (2013.01); *H01L 23/49575* (2013.01)

(58) Field of Classification Search
CPC ..... H01L 23/34; H01L 23/3675; H01L 23/40; H01L 23/42; H01L 23/427; H01L 23/4334; H01L 23/46; H01L 23/467; H01L 23/473
See application file for complete search history.

(56) References Cited

U.S. PATENT DOCUMENTS

| | | | |
|---|---|---|---|
| 2009/0161300 A1* | 6/2009 | Chou | H05K 7/20363 361/619 |
| 2011/0156082 A1* | 6/2011 | Yu | H01L 33/641 257/99 |
| 2018/0317312 A1* | 11/2018 | Viswanathan | H01L 21/78 |

* cited by examiner

*Primary Examiner* — Jae Lee
(74) *Attorney, Agent, or Firm* — Foley & Lardner LLP

(57) ABSTRACT

A semiconductor package structure includes a vapor chamber, a plurality of electrical contacts, a semiconductor die and an encapsulant. The vapor chamber defines an enclosed chamber for accommodating a working liquid. The electrical contacts surround the vapor chamber. The semiconductor die is disposed on the vapor chamber, and electrically connected to the electrical contacts through a plurality of bonding wires. The encapsulant covers a portion of the vapor chamber, portions of the electrical contacts, the semiconductor die and the bonding wires.

20 Claims, 35 Drawing Sheets

SEMICONDUCTOR PACKAGE STRUCTURE AND ASSEMBLY STRUCTURE

CROSS-REFERENCE TO RELATED APPLICATIONS

This application claims the benefit of and priority to U.S. Provisional Application No. 62/742,239, filed Oct. 5, 2018, the contents of which are incorporated herein by reference in their entirety.

BACKGROUND

1. Field of the Disclosure

The present disclosure relates to a semiconductor package structure and an assembly structure, and to a semiconductor package structure and an assembly structure including a vapor chamber.

2. Description of the Related Art

A specification of a semiconductor package structure may include a high-speed data transmission capability, a high data capacity and a small footprint. Heat dissipation is also an issue for such a semiconductor package structure. During operation, high-speed data transmission can result in a significant amount of heat being generated and can raise a temperature of the semiconductor package structure. Due to the small size of the semiconductor package structure, it can be difficult to dissipate the heat. If the heat is not dissipated efficiently, the performance of the semiconductor package structure can be decreased, or the semiconductor package structure may break down or be rendered inoperative.

SUMMARY

In some embodiments, a semiconductor package structure includes a vapor chamber, a plurality of electrical contacts, a semiconductor die and an encapsulant. The vapor chamber defines an enclosed chamber for accommodating a working liquid. The electrical contacts surround the vapor chamber. The semiconductor die is disposed on the vapor chamber, and electrically connected to the electrical contacts through a plurality of bonding wires. The encapsulant covers a portion of the vapor chamber, portions of the electrical contacts, the semiconductor die and the bonding wires.

In some embodiments, an assembly structure includes a main substrate and a semiconductor package structure. The semiconductor package structure is thermally connected to the main substrate. The semiconductor package structure includes a vapor chamber, a semiconductor die and an encapsulant. The semiconductor die is thermally connected to the vapor chamber. The encapsulant covers a portion of the vapor chamber and the semiconductor die. The vapor chamber is disposed between the semiconductor die and the main substrate and forms a heat transfer path from the semiconductor die to the main substrate.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
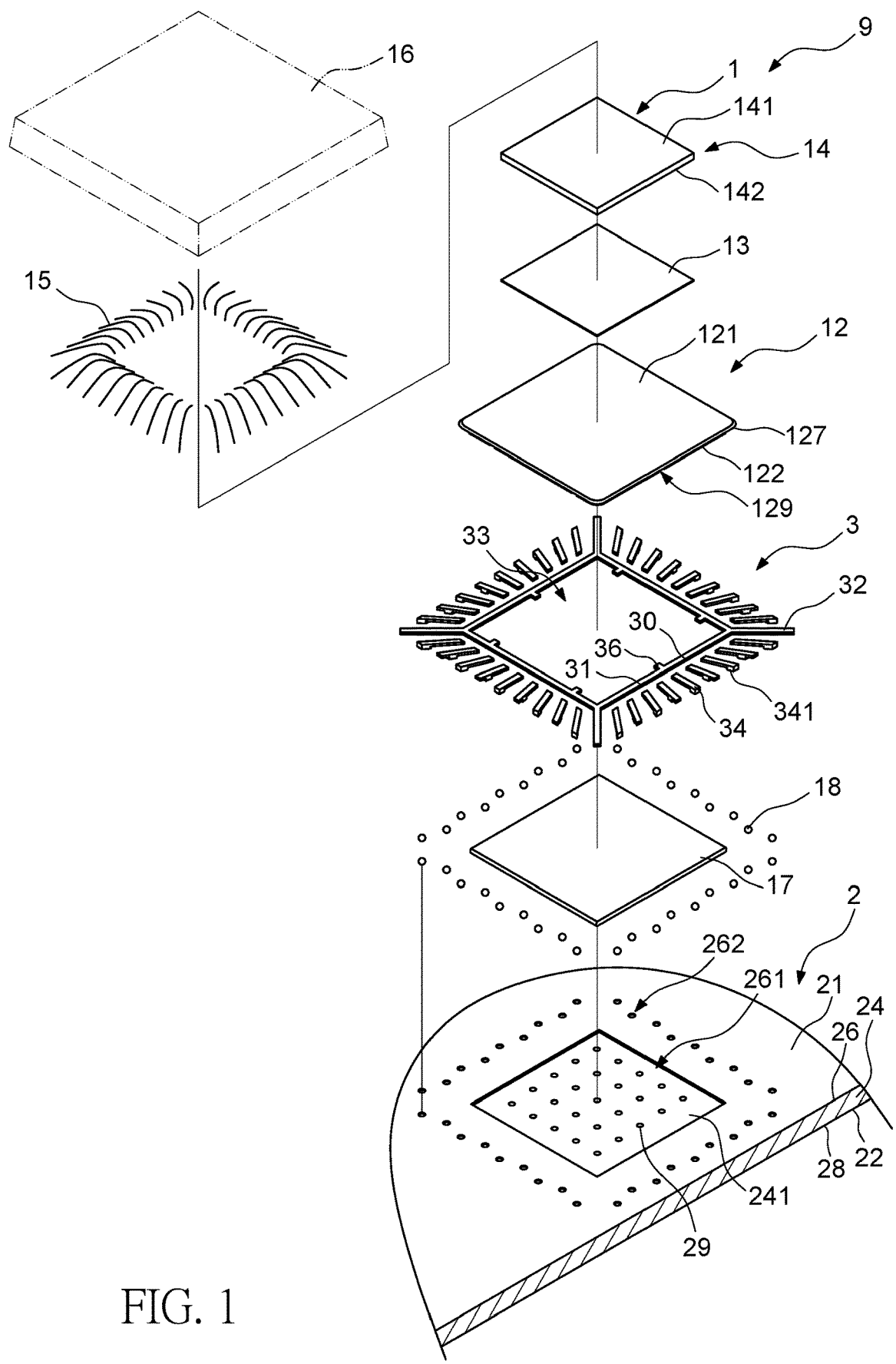
FIG. 1 illustrates an exploded perspective view of an assembly structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

To meet the specification of increasing functions, a number of devices integrated in a semiconductor package structure should increase. Thus, the power density and a number of heat sources are increased, and the thermal resistance is relatively large. In addition, it is difficult to dissipate the heat generated by the device at the center of the semiconductor package structure. To address the above concerns, in some comparative embodiments, a fan is provided. The fan is attached to the semiconductor package structure to dissipate the heat at the periphery of the semiconductor package structure by air flow. However, such fan may not dissipate the heat generated by the device at the center of the semiconductor package structure. In some comparative embodiments, a number of substrate vias or a thickness of metal layer are increased. However, the improvement of heat dissipation efficiency is slight. In some comparative embodiments, a thermal interface material (TIM) is used to be interposed between the devices and the package substrate. However, the temperature of the device at the center of the semiconductor package structure may not be hugely reduced.

At least some embodiments of the present disclosure provide for a semiconductor package structure and an assembly structure which have high improvements of heat dissipation efficiency. In some embodiments, the semiconductor package structure includes a vapor chamber for dissipating a heat generated by a semiconductor die of the semiconductor package structure.

Figure 2:
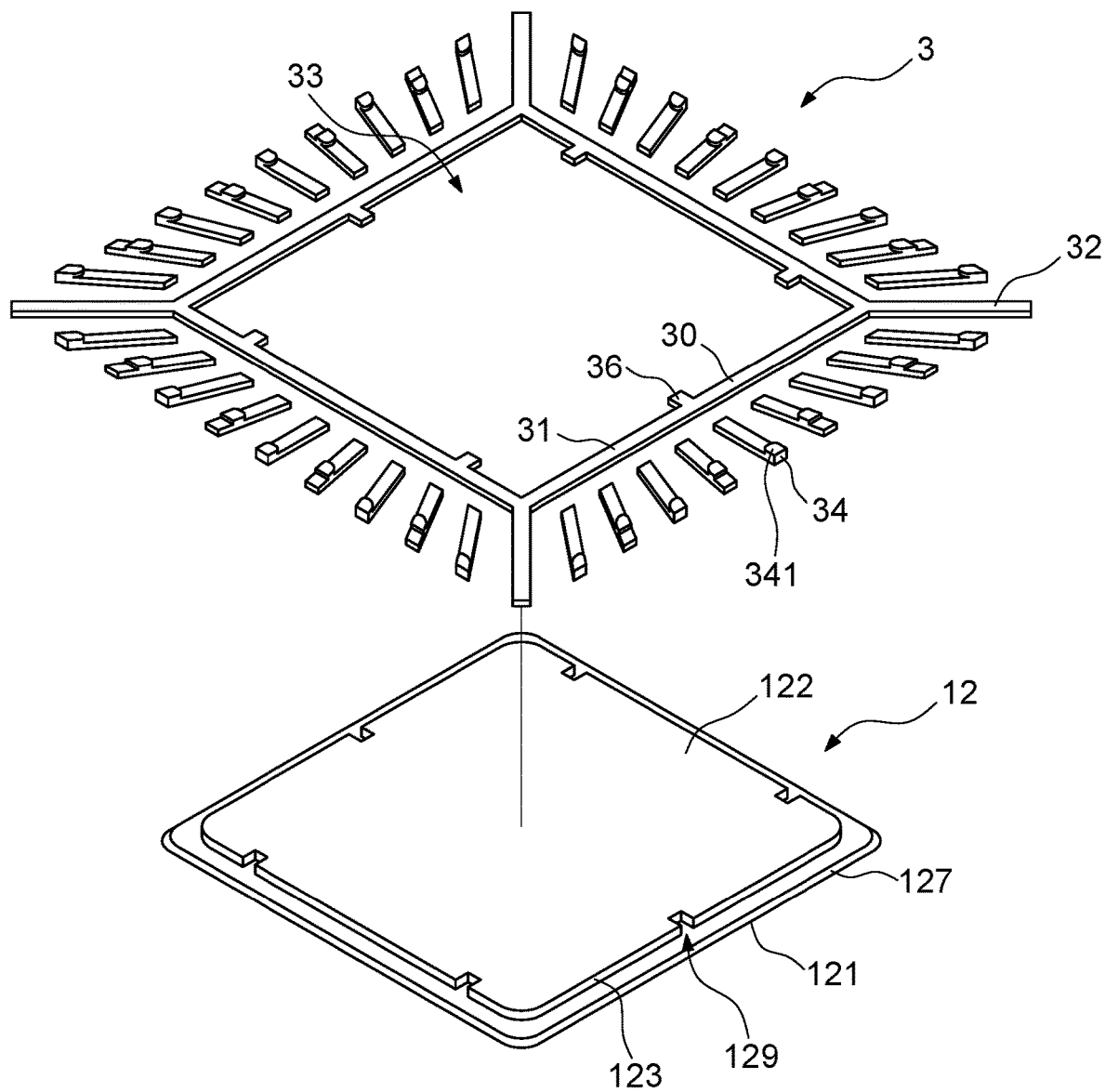
FIG. 2 illustrates a bottom perspective view of the lead frame and the vapor chamber of FIG. 1.
Figure 3:
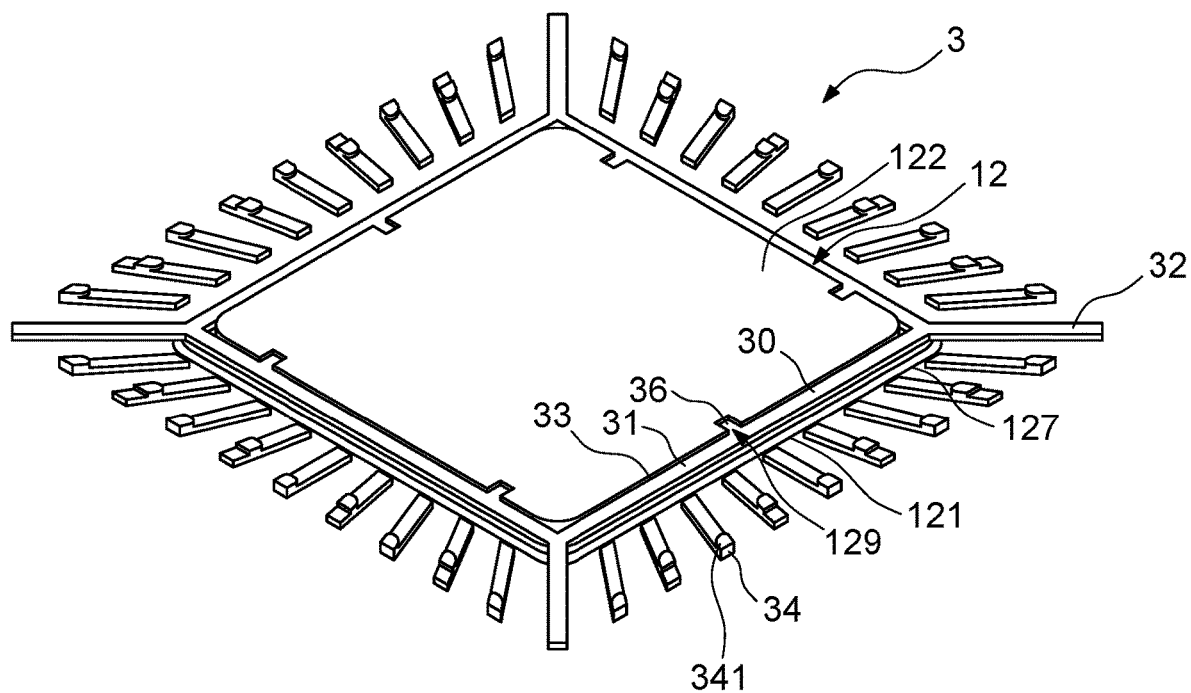
FIG. 3 illustrates an assembled bottom perspective view of the lead frame and the vapor chamber of FIG. 2.
Figure 4:
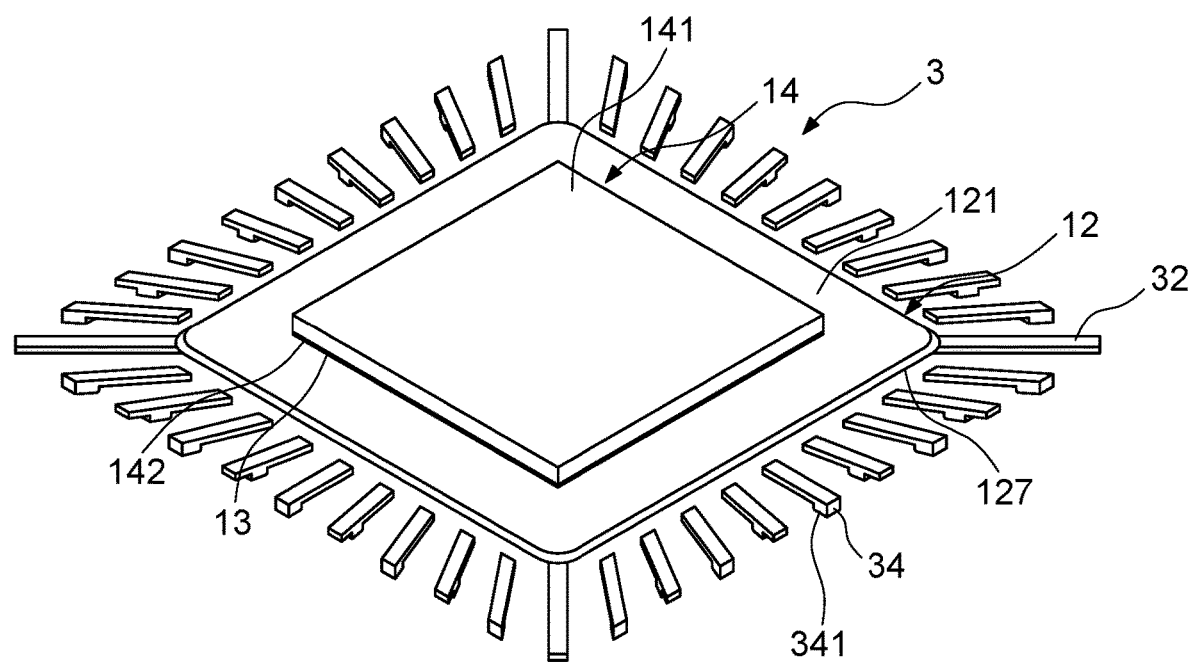
FIG. 4 illustrates an assembled top perspective view of the lead frame, the vapor chamber and the semiconductor die of FIG. 1.
Figure 5:
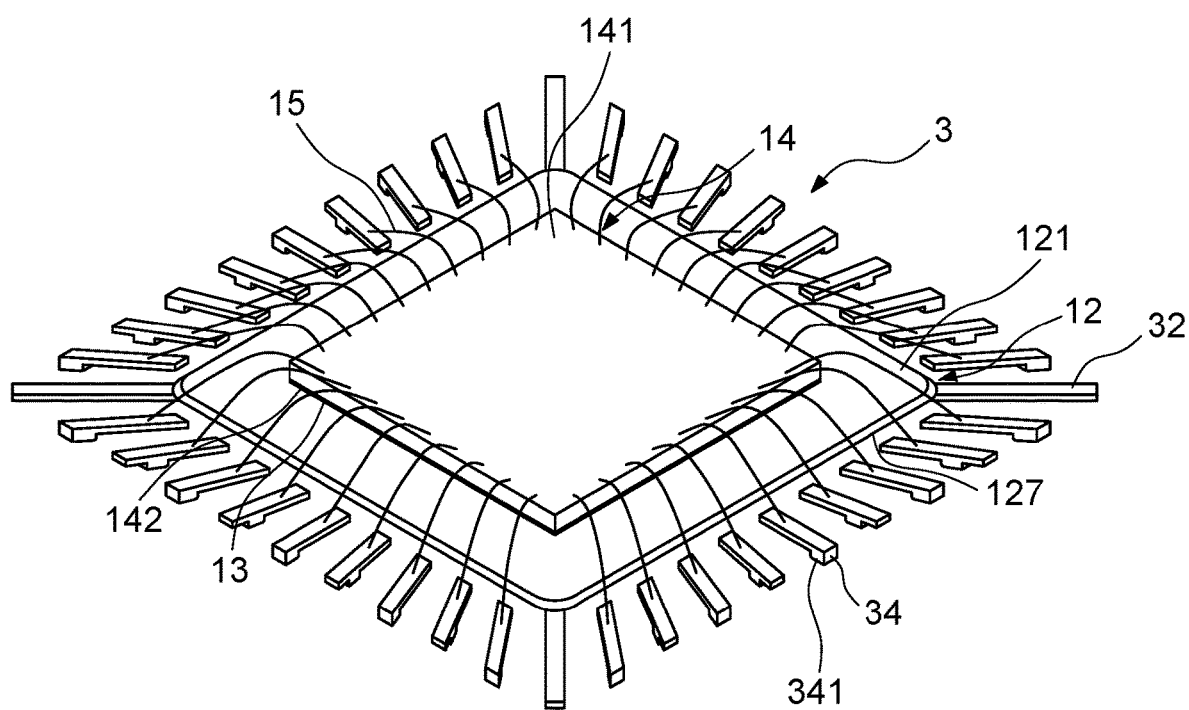
FIG. 5 illustrates an assembled top perspective view of the lead frame, the vapor chamber, the semiconductor die and the bonding wires of FIG. 1.
Figure 6:
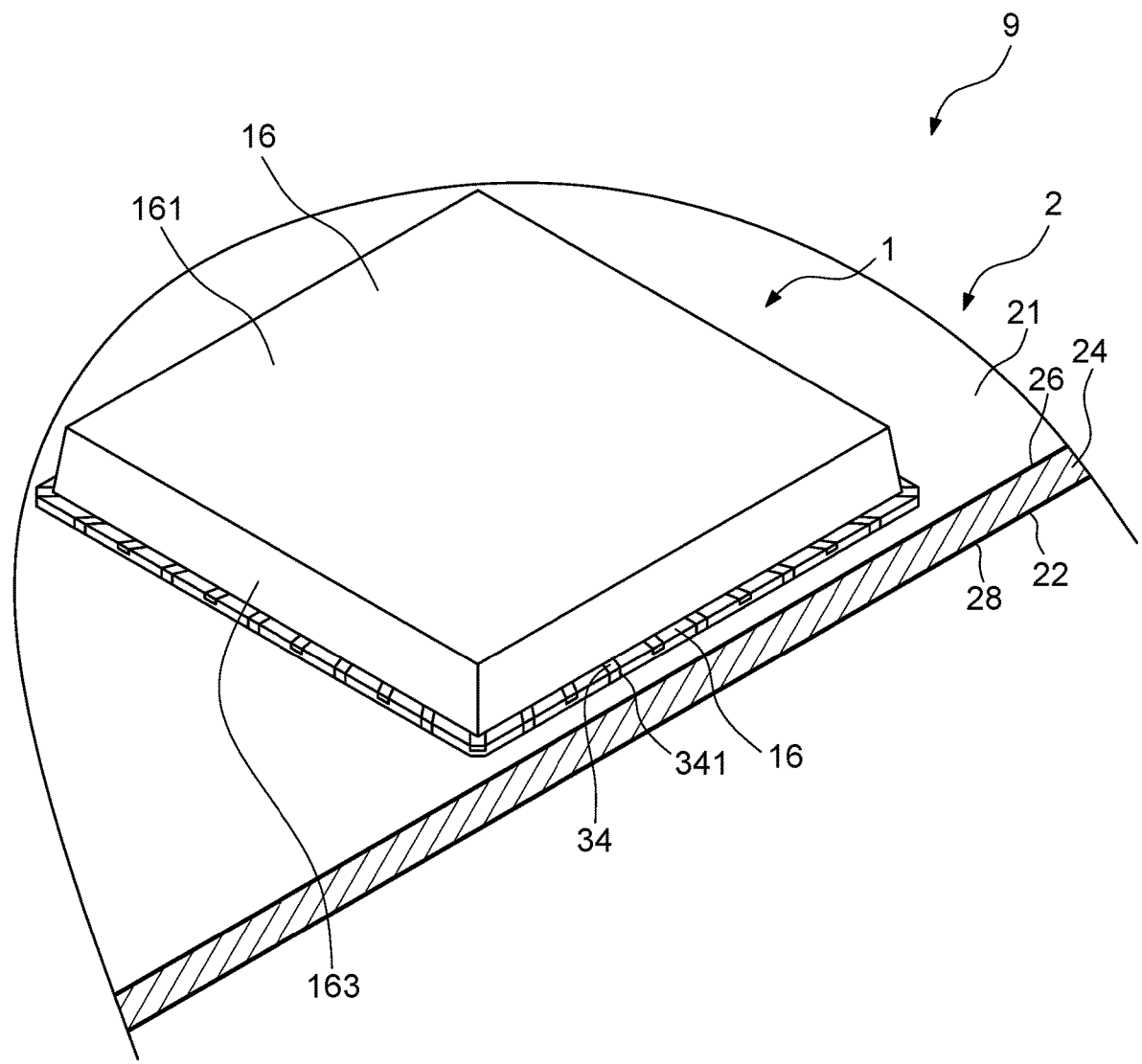
FIG. 6 illustrates an assembled perspective view of the assembly structure of FIG. 1.
Figure 7:
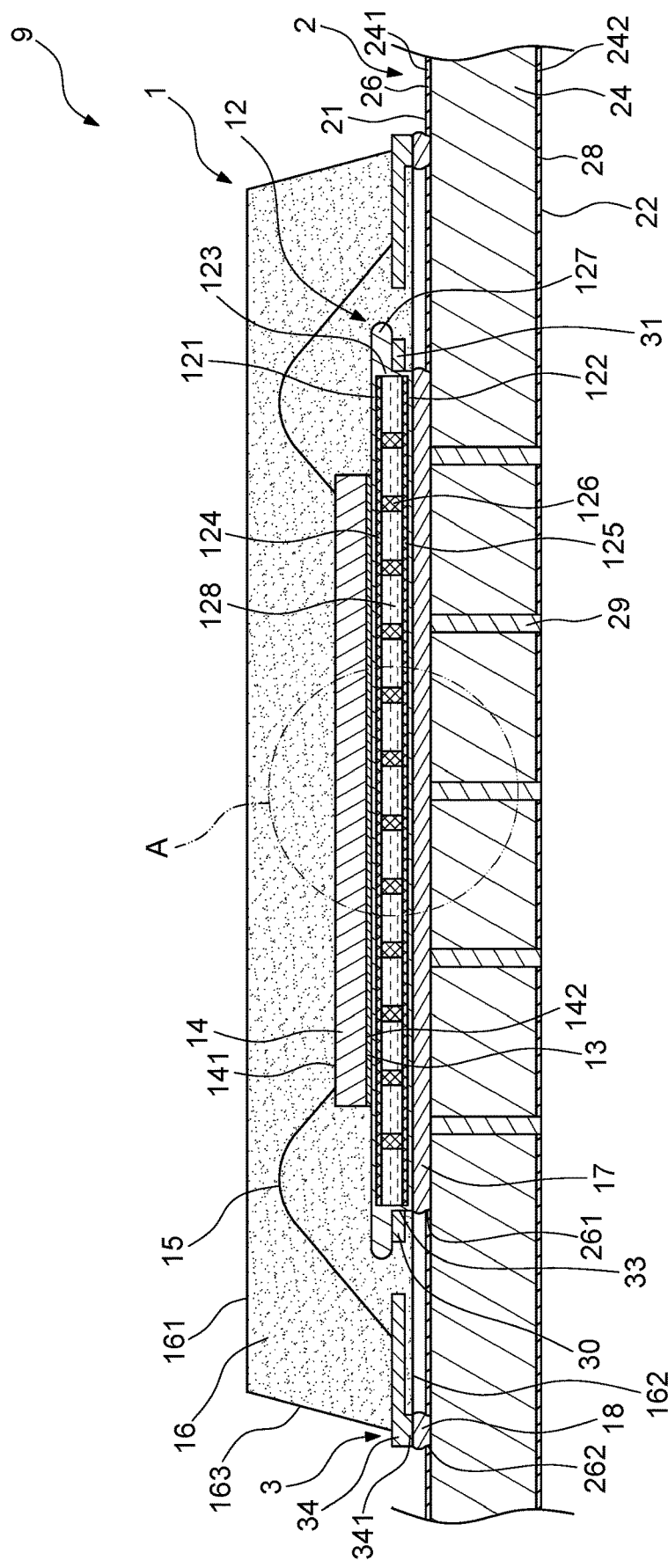
FIG. 7 illustrates a cross-sectional view of the assembly structure of FIG. 6.

FIG. 1 illustrates an exploded perspective view of an assembly structure 9 according to some embodiments of the present disclosure. FIG. 2 illustrates a bottom perspective view of the lead frame 3 and the vapor chamber 12 of FIG. 1. FIG. 3 illustrates an assembled bottom perspective view of the lead frame 3 and the vapor chamber 12 of FIG. 2. FIG. 4 illustrates an assembled top perspective view of the lead frame 3, the vapor chamber 12 and the semiconductor die 14 of FIG. 1. FIG. 5 illustrates an assembled top perspective view of the lead frame 3, the vapor chamber 12, the semiconductor die 14 and the bonding wires 15 of FIG. 1. FIG. 6 illustrates an assembled perspective view of the assembly structure 9 of FIG. 1. FIG. 7 illustrates a cross-sectional view of the assembly structure 9 of FIG. 6.

As shown in FIG. 1, FIG. 6 and FIG. 7, the assembly structure 9 includes a main substrate 2 and a semiconductor package structure 1. As shown in FIG. 1 and FIG. 7, the main substrate 2 (e.g., a printed circuit board, PCB) has a first surface 21 (e.g., a top surface) and a second surface 22 (e.g., a bottom surface) opposite to the first surface 21, and includes a main body 24, a first protection layer 26, a second protection layer 28 and a plurality of thermal vias 29. The main body 24 has a first surface 241 (e.g., a top surface) and a second surface 242 (e.g., a bottom surface) opposite to the first surface 241. The main body 24 may include a plurality of passivation layers (not shown) and a plurality of circuit layers (not shown) interposed between the passivation layers. The first protection layer 26 and the second protection layer 28 may be solder resist layers. The first protection layer 26 is disposed on the first surface 241 of the main body 24. The first protection layer 26 may define a central opening 261 and a plurality of outer openings 262 extending through the first protection layer 26 to expose portions of the circuit layer of the main body 24. The second protection layer 28 is disposed on the second surface 242 of the main body 24. The thermal vias 29 may extend through the main substrate 2, and one end of each of the thermal vias 29 may be exposed from the first surface 241 in the central opening 261.

The semiconductor package structure 1 is electrically connected to the first surface 21 of the main substrate 2. The semiconductor package structure 1 may be a QFN (Quad Flat No leads) package. The semiconductor package structure 1 includes a lead frame 3, a vapor chamber 12, a thermal paste 13, at least one semiconductor die 14, a plurality of bonding wires 15, an encapsulant 16, a central connecting element 17 and a plurality of outer connecting elements 18.

As shown in FIG. 2, the lead frame 3 includes a frame 30, four connecting bars 32, and a plurality of electrical contacts 34 (e.g., strip leads) surrounding the frame 30. The frame 30 may include four inner bars 31 that are connected to one another to form a ring structure and define a central opening 33. The four connecting bars 32 connect the four corners of the frame 30 and extend outwardly. The electrical contacts 34 (e.g., strip leads) are disposed around the frame 30. The electrical contacts 34 (e.g., strip leads) do not connect the frame 30 and extend outwardly. In one embodiment, a protrusion pad 341 may be further disposed on a bottom surface of an end portion of the electrical contact 34 (e.g., strip lead). In addition, the frame 30 includes a plurality of fixing pins 36 extending inwardly. That is, the fixing pins 36 extend toward the central opening 33 from the inner bars 31 of the frame 30. The material of the lead frame 3 (including the frame 30, the connecting bars 32, the electrical contacts 34 (e.g., strip leads), the protrusion pads 341 and the fixing pins 36) may be copper. The thicknesses of the frame 30, the connecting bars 32 and the electrical contacts 34 are substantially equal to each other (about 0.2 mm), and may be disposed at a same horizontal level.

As shown in FIG. 2, FIG. 3 and FIG. 7, the vapor chamber 12 is disposed in the central opening 33 of the frame 30. The vapor chamber 12 includes a top wall 121, a bottom wall 122, a lateral wall 123, a top wick structure 124, a bottom wick structure 125, a plurality of wick bars 126, a periphery rim 127 and a working liquid 128. The material of the top wall 121, the bottom wall 122 and the lateral wall 123 may be copper, copper alloy, aluminum alloy, stainless steel or other suitable metal. The top wall 121, the bottom wall 122 and the lateral wall 123 are connected or sealed together to define an enclosed chamber for accommodating the working liquid 128. A material of the working liquid 128 may be water, ethanol, acetone, isopropanol, chlorofluorocarbon (CFC) or other suitable material. The top wick structure 124 is disposed on an inner surface (e.g., bottom surface) of the top wall 121. The bottom wick structure 125 is disposed on an inner surface (e.g., top surface) of the bottom wall 122. The wick bars 126 are disposed in the enclosed chamber, and two ends of each of the wick bars 126 connect the top wall 121 and the bottom wall 122 respectively. A thickness of the vapor chamber 12 may be about 0.4 mm to 0.6 mm. In some embodiments, the periphery rim 127 extends horizontally outward from the lateral wall 123.

The periphery rim 127 of the vapor chamber 12 is disposed on the top surfaces of the inner bars 31 the frame 30. That is, the top surfaces of the inner bars 31 the frame 30 are used to support the periphery rim 127 of the vapor chamber 12, and the bottom portion of the vapor chamber 12 is located within the central opening 33 of the frame 30. In addition, the vapor chamber 12 may further define a plurality of recess portions 129 at the lateral wall 123. The amount and the position of the recess portions 129 of the vapor chamber 12 correspond to the amount and the position of the fixing pins 36 of the frame 30. Thus, after assembly, the fixing pins 36 of the frame 30 are disposed in a respective one of the recess portions 291 of the lateral wall 123 of the vapor chamber 12, so as to prevent the shift between the vapor chamber 12 and the frame 30 of the lead frame 3 during a molding process.

As shown in FIG. 4 and FIG. 7, the semiconductor die 14 is disposed on the vapor chamber 12. In one embodiment, the semiconductor die 14 is thermally connected and physically connected to the top wall 121 of the vapor chamber 12 through the thermal paste 13. The thermal paste 13 may be a thermal interface material (TIM) with a thermal conductivity of about 30 W/mK to about 40 W/mK. The semiconductor die 14 has a first surface 141 (e.g., an active surface) and a second surface 142 (e.g., a backside surface) opposite to the first surface 141. A thickness of the semiconductor die 14 may be about 0.5 mm to about 0.6 mm. The second surface 142 of the semiconductor die 14 is adhered to the top wall 121 of the vapor chamber 12 through the thermal paste 13.

As shown in FIG. 5 and FIG. 7, the semiconductor die 14 is electrically connected to the electrical contacts 34 (e.g., strip leads) of the lead frame 3 through the bonding wires 15. In one embodiment, the first surface 141 of the semiconductor die 14 is electrically connected to the top surfaces of the electrical contacts 34 (e.g., strip leads) of the lead frame 3 through the bonding wires 15. The material of the bonding wires 15 may be gold or copper.

As shown in FIG. 6 and FIG. 7, the encapsulant 16 (e.g., molding compound) covers a portion of the vapor chamber 12, portions of the electrical contacts 34 (e.g., strip leads) of the lead frame 3, the semiconductor die 14 and the bonding wires 15. That is, the vapor chamber 12, the electrical contacts 34, the semiconductor die 14 and the bonding wires 15 are embedded in the encapsulant 16. The encapsulant 16 has a top surface 161, a bottom surface 162 opposite to the top surface 161 and a side surface 163 extending between the top surface 161 and the bottom surface 162. The side surface 163 of the encapsulant 16 may be a slant surface and may not cover the outermost ends of the electrical contacts 34 (e.g., strip leads). That is, the outermost ends of the electrical contacts 34 (e.g., strip leads) may be exposed from the encapsulant 16. In addition, the bottom surfaces of the protrusion pads 341 of the electrical contacts 34 (e.g., strip leads) of the lead frame 3 and the bottom surface of the bottom wall 122 of the vapor chamber 12 may be substantially coplanar with the bottom surface 162 of the encapsulant 16. That is, the bottom surfaces of the protrusion pads 341 of the electrical contacts 34 (e.g., strip leads) of the lead frame 3 and the bottom surface of the bottom wall 122 of the vapor chamber 12 may be exposed from the bottom surface 162 of the encapsulant 16. As shown in FIG. 7, there may be a gap between the bottom surface 162 of the encapsulant 16 and the first surface 21 of the main substrate 2.

The central connecting element 17 (e.g., solder material such as solder bump) is disposed adjacent to the bottom surface of the bottom wall 122 of the vapor chamber 12. The bottom portion of the central connecting element 17 is disposed in the central opening 261 of the first protection layer 26 to cover and contact the ends of the thermal vias 29. Thus, the bottom wall 122 of the vapor chamber 12 is mounted or attached to the main body 24 of the main substrate 2 through the central connecting element 17. The central connecting element 17 may be a thermal interface material (TIM) with a thermal conductivity of about 30 W/mK to about 40 W/mK. Thus, the vapor chamber 12 of the semiconductor package structure 1 is thermally connected to the thermal vias 29 of the main substrate 2, and the heat from the vapor chamber 12 can be dissipated to the second surface 22 of the main substrate 2 through the thermal vias 29. That is, the vapor chamber 12 is disposed between the semiconductor die 14 and the main substrate 2, and forms or provides a heat transfer path (or a heat dissipating path) from the semiconductor die 14 to the main substrate 2.

Meanwhile, the outer connecting elements 18 (e.g., solder materials such as solder bumps) are disposed adjacent to the bottom surfaces of protrusion pads 341 of the electrical contacts 34 (e.g., strip leads) of the lead frame 3. The bottom portion of the outer connecting elements 18 (e.g., solder bumps) are disposed in the outer openings 262 of the first protection layer 26 so that the electrical contacts 34 (e.g., strip leads) of the lead frame 3 are electrically connected to the circuit layer of the main body 24 of the main substrate 2.

Figure 8:
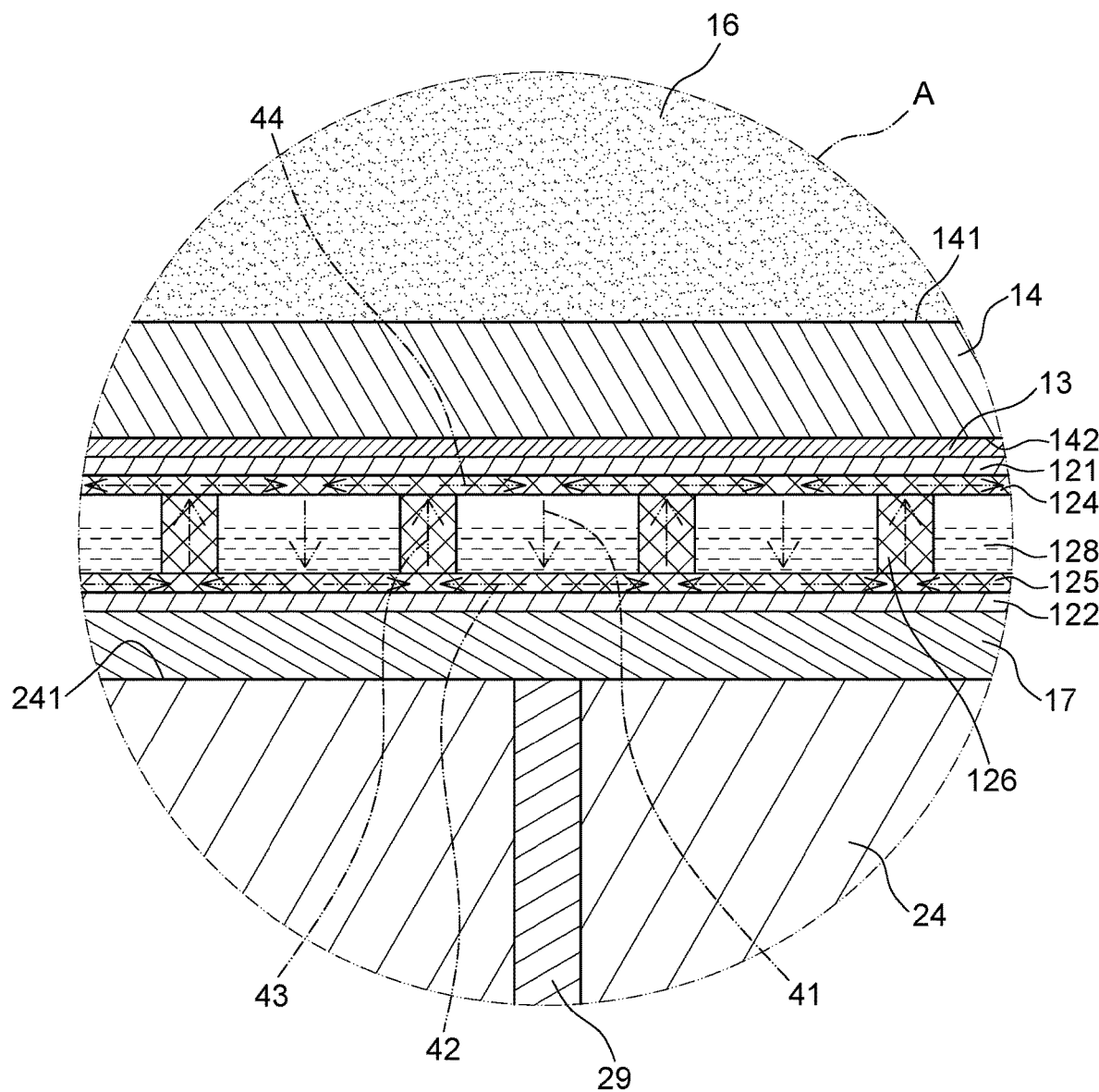
FIG. 8 illustrates an enlarged view of an area "A" shown in FIG. 7.

FIG. 8 illustrates an enlarged view of an area "A" shown in FIG. 7. During the operation of the semiconductor die 14, the heat generated by the semiconductor die 14 will be absorbed by the working liquid 128 on the top wick structure 124 of the vapor chamber 12 to heat the working liquid 128 become high-temperature fluid or high-temperature vapor. The heated working liquid 128 (e.g., high-temperature fluid or high-temperature vapor) will move downwardly to the bottom wick structure 125, as shown in the first path 41. Then, the heated working liquid 128 (e.g., high-temperature fluid or high-temperature vapor) will be cooled by the thermal vias 29 to become low-temperature liquid or low-temperature vapor, and then will move horizontally to the bottom portions of the wick bars 126, as shown in the second path 42. Then, the working liquid 128 will move upwardly along the wick bars 126 to the top wick structure 124, as shown in the third path 43. Then, the working liquid 128 on the top wick structure 124 will move horizontally, as shown in the fourth path 44. Then, the working liquid 128 on the top wick structure 124 can absorb the heat generated by the semiconductor die 14. Thus, the circulation of the working liquid 128 and its vapor forms a loop of thermal conduction. The vapor chamber 12 can conduct the heat evenly and quickly so as to obtain an even temperature distribution.

Figure 9:
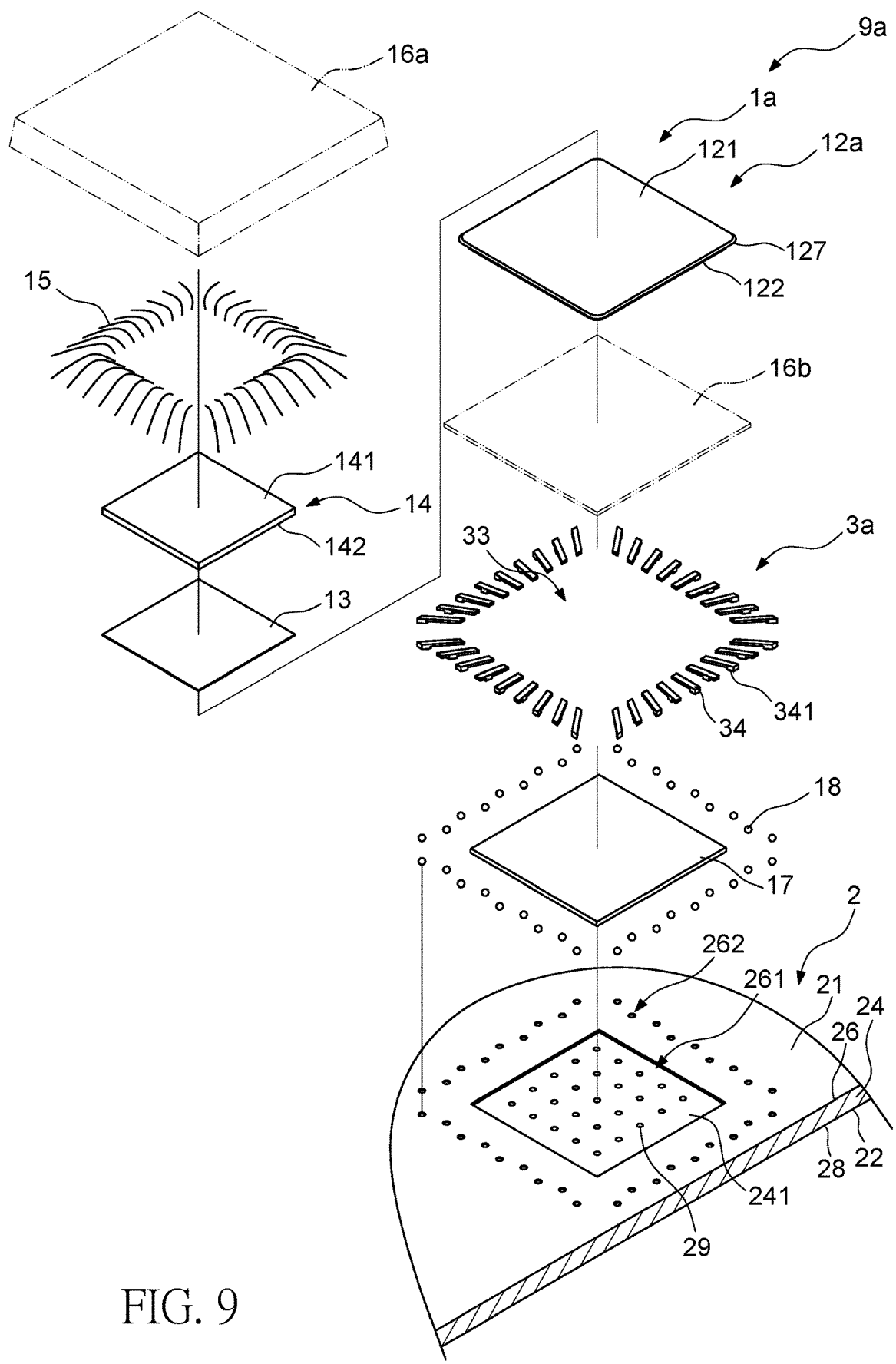
FIG. 9 illustrates an exploded perspective view of an assembly structure according to some embodiments of the present disclosure.
Figure 10:
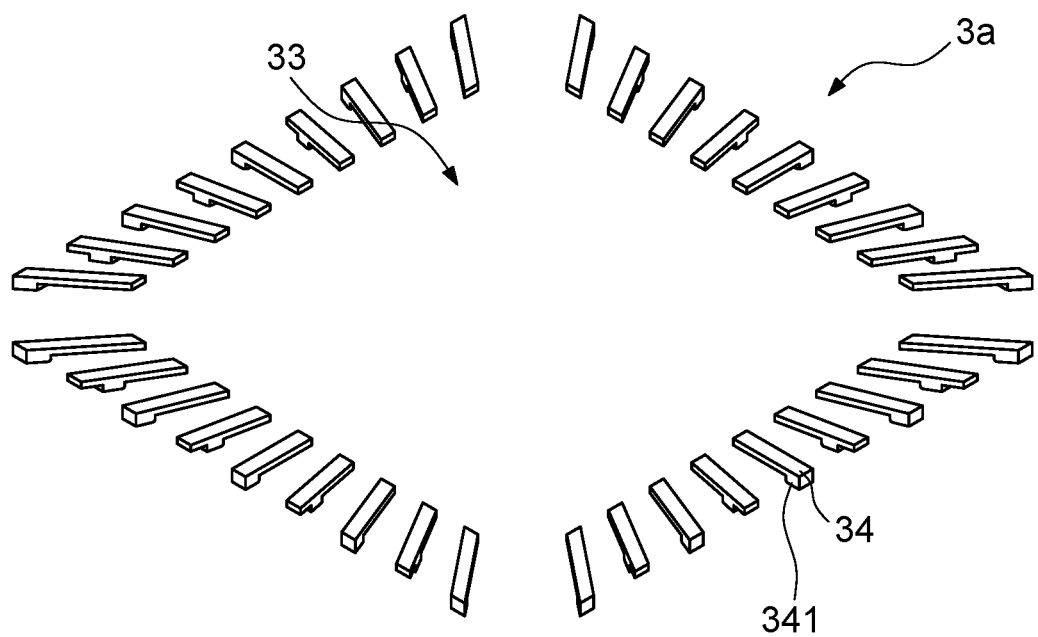
FIG. 10 illustrates a perspective view of the lead frame of FIG. 9.
Figure 11:
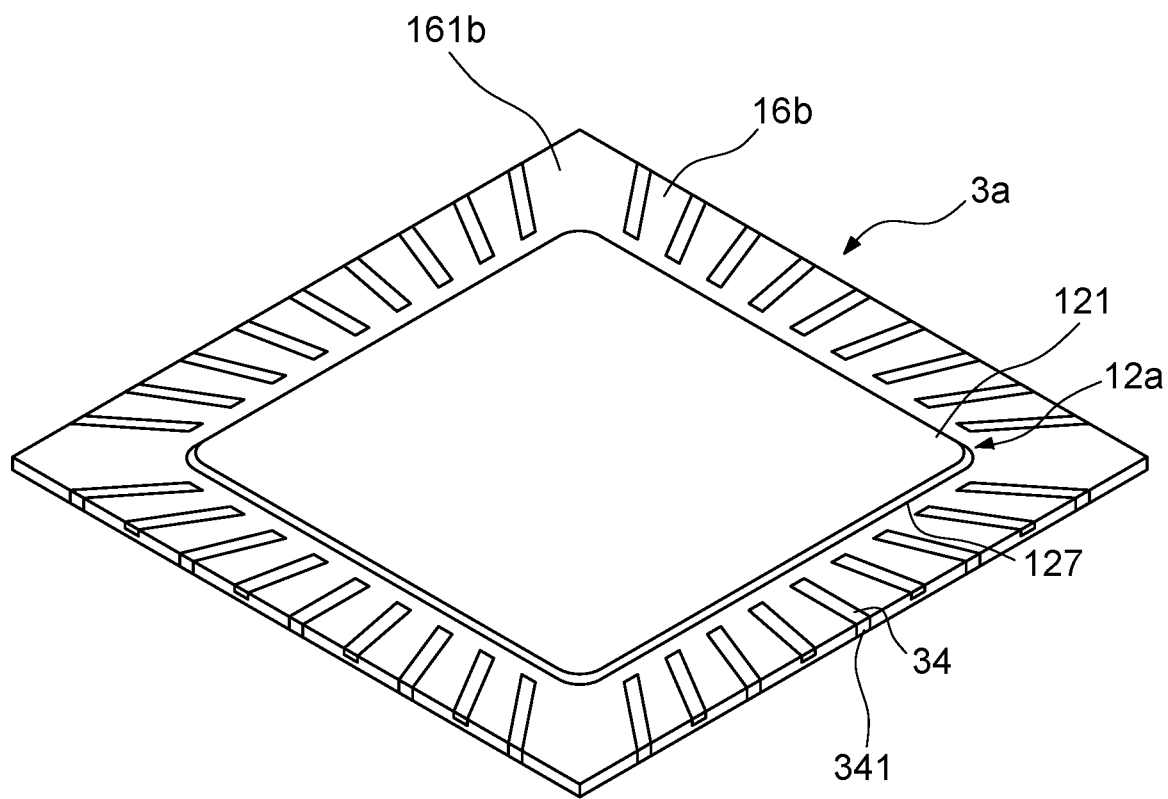
FIG. 11 illustrates an assembled perspective view of the lead frame, the vapor chamber and the bottom encapsulant of FIG. 9.
Figure 12:
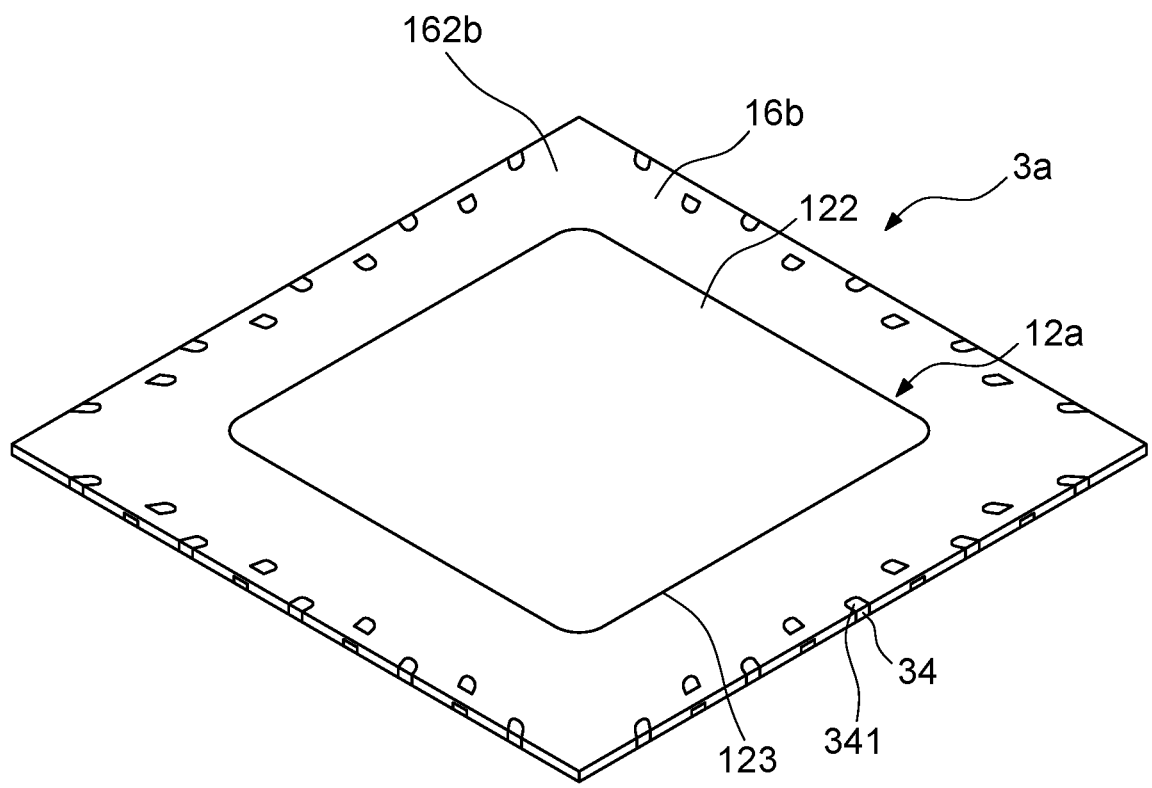
FIG. 12 illustrates a bottom perspective view of the lead frame, the vapor chamber and the bottom encapsulant of FIG. 11.
Figure 13:
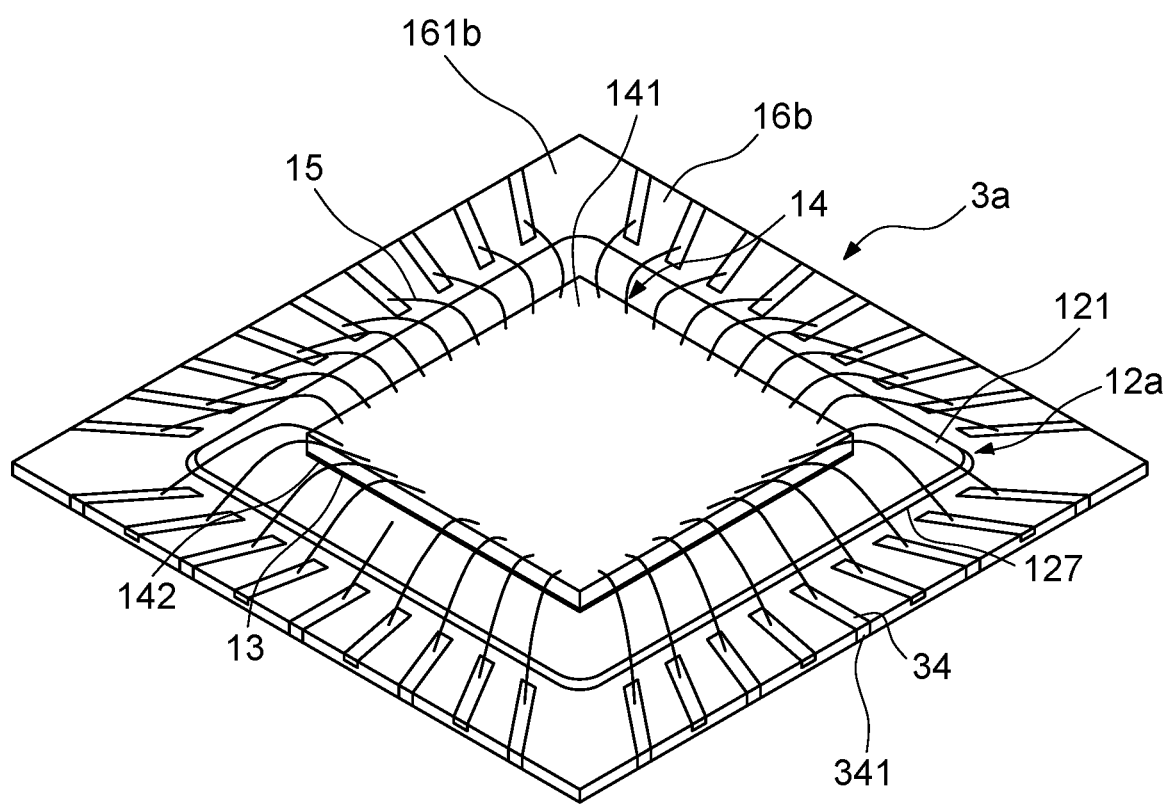
FIG. 13 illustrates an assembled top perspective view of the lead frame, the vapor chamber, the semiconductor die and the bonding wires of FIG. 9.
Figure 14:
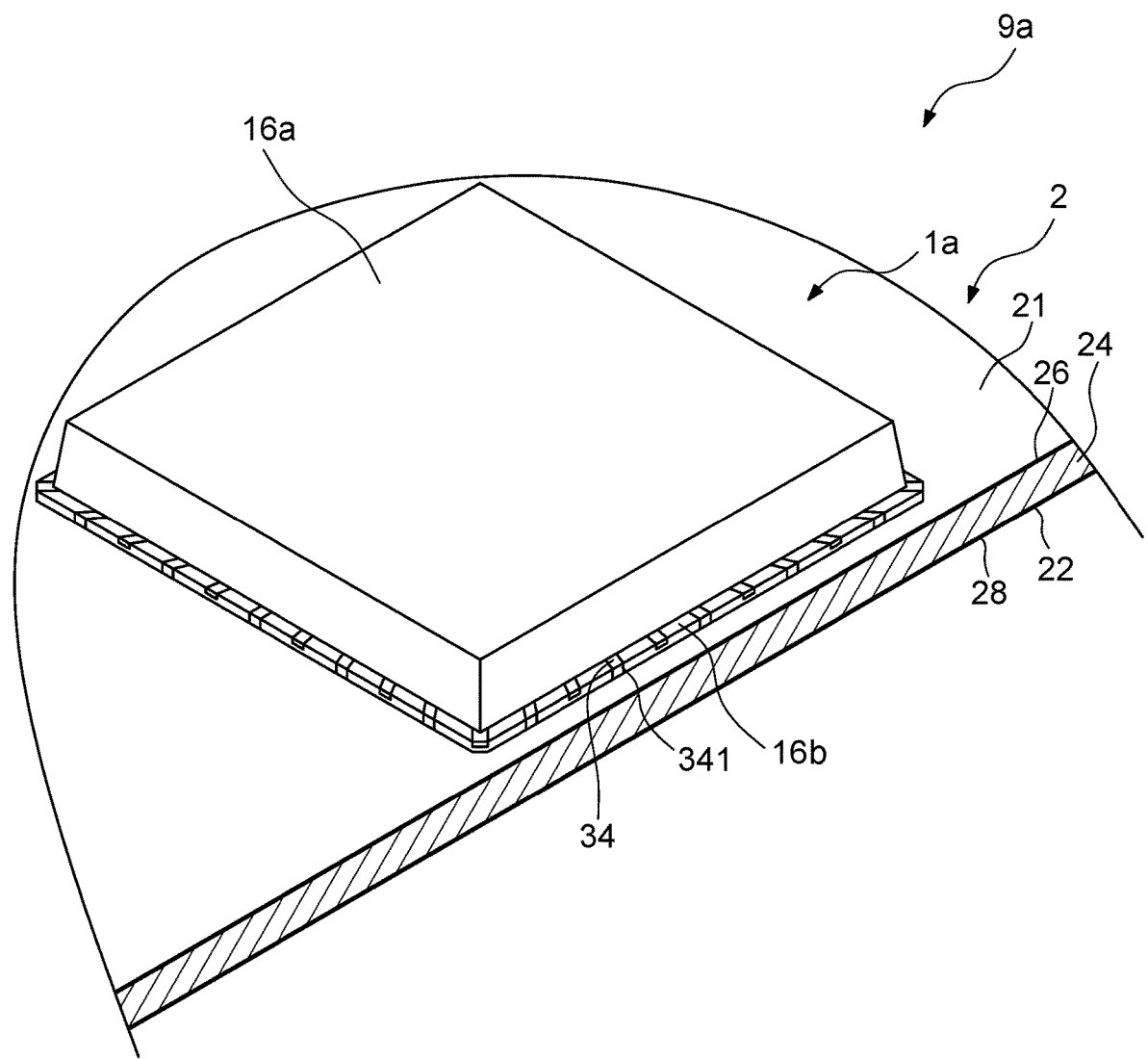
FIG. 14 illustrates an assembled perspective view of the assembly structure of FIG. 9.
Figure 15:
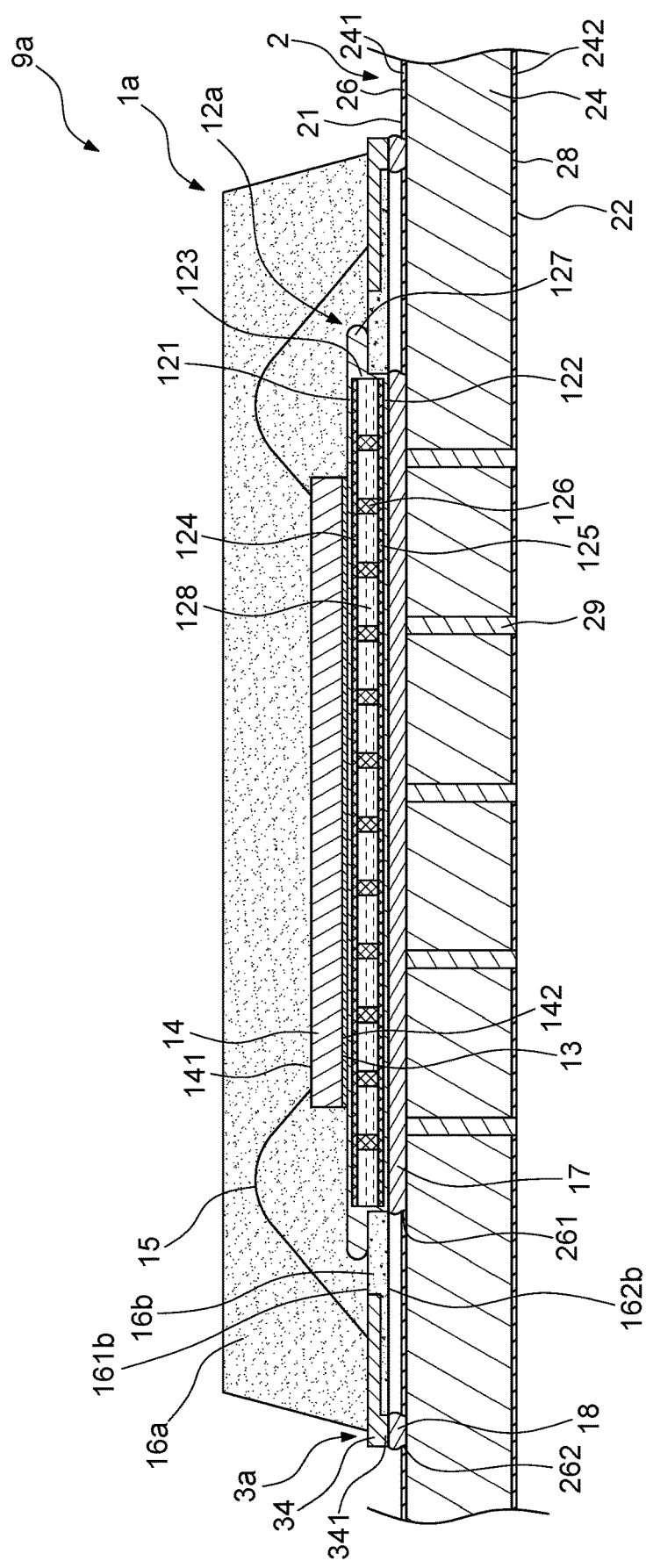
FIG. 15 illustrates a cross-sectional view of the assembly structure of FIG. 14.

FIG. 9 illustrates an exploded perspective view of an assembly structure 9a according to some embodiments of the present disclosure. FIG. 10 illustrates a perspective view of the lead frame 3a of FIG. 9. FIG. 11 illustrates an assembled perspective view of the lead frame 3a, the vapor chamber 12a and the bottom encapsulant 16b of FIG. 9. FIG. 12 illustrates a bottom perspective view of the lead frame 3a, the vapor chamber 12a and the bottom encapsulant 16b of FIG. 11. FIG. 13 illustrates an assembled top perspective view of the lead frame 3a, the vapor chamber 12a, the semiconductor die 14 and the bonding wires 15 of FIG. 9. FIG. 14 illustrates an assembled perspective view of the assembly structure 9a of FIG. 9. FIG. 15 illustrates a cross-sectional view of the assembly structure 9a of FIG. 14.

The assembly structure 9a of FIG. 9 to FIG. 15 is similar to the assembly structure 9 of FIG. 1 to FIG. 8, and the differences are described as follows. The semiconductor package structure 1a of the assembly structure 9a includes a lead frame 3a, a vapor chamber 12a, a bottom encapsulant 16b, a thermal paste 13, at least one semiconductor die 14, a plurality of bonding wires 15, a top encapsulant 16a, a central connecting element 17 and a plurality of outer connecting elements 18.

As shown in FIG. 10, the lead frame 3a includes a plurality of electrical contacts 34 (e.g., strip leads) surrounding a central opening 33. In one embodiment, the electrical contacts 34 may be separated, and may be spaced apart from one another. That is, the lead frame 3a does not include the frame 30 (e.g., the four inner bars 31) and the four connecting bars 32 of FIG. 2. In one embodiment, a protrusion pad 341 may be further disposed on a bottom surface of an end portion of the electrical contact 34 (e.g., strip lead).

As shown in FIG. 11, the vapor chamber 12a is disposed in the central opening 33 of the lead frame 3a. The vapor chamber 12a of FIG. 9 and FIG. 11 is similar to the semiconductor vapor chamber 12 of FIG. 1 to FIG. 8 except that the vapor chamber 12a of FIG. 9 and FIG. 11 does not include the recess portions 129 at the lateral wall 123. The bottom encapsulant 16b (e.g., a pre-mold) covers a portion of the vapor chamber 12a and portions of the electrical contacts 34 (e.g., strip leads). As shown in FIG. 11, FIG. 12 and FIG. 15, the bottom encapsulant 16b has a top surface 161b and a bottom surface 162b opposite to the top surface 161b. The top surfaces of the electrical contacts 34 (e.g., strip leads) are substantially coplanar with the top surface 161b of the bottom encapsulant 16b. The top surface of the vapor chamber 12a protrudes from the top surface 161b of the bottom encapsulant 16b. In one embodiment, the top wall 121 of the vapor chamber 12a protrudes from the top surface 161b of the bottom encapsulant 16b. Thus, the top surfaces of the electrical contacts 34 (e.g., strip leads) and the top wall 121 of the vapor chamber 12a are exposed from the top surface 161b of the bottom encapsulant 16b.

As shown in FIG. 12 and FIG. 15, the bottom surfaces of the protrusion pads 341 of the electrical contacts 34 (e.g., strip leads) of the lead frame 3a and the bottom surface of the bottom wall 122 of the vapor chamber 12a may be substantially coplanar with the bottom surface 162b of the bottom encapsulant 16b. That is, the bottom surfaces of the protrusion pads 341 of the electrical contacts 34 (e.g., strip leads) of the lead frame 3a and the bottom surface of the bottom wall 122 of the vapor chamber 12a may be exposed from the bottom surface 162b of the bottom encapsulant 16b.

As shown in FIG. 13 and FIG. 15, the semiconductor die 14 is disposed on the vapor chamber 12a. In one embodiment, the semiconductor die 14 is thermally connected and physically connected to the top wall 121 of the vapor chamber 12a through the thermal paste 13. The semiconductor die 14 has a first surface 141 (e.g., an active surface) and a second surface 142 (e.g., a backside surface) opposite to the first surface 141. The second surface 142 of the semiconductor die 14 is adhered to the top wall 121 of the vapor chamber 12a through the thermal paste 13. Then, the first surface 141 of the semiconductor die 14 is electrically connected to the top surfaces of the electrical contacts 34 (e.g., strip leads) of the lead frame 3a through the bonding wires 15.

As shown in FIG. 14 and FIG. 15, the top encapsulant 16a (e.g., molding compound) is disposed on the bottom encapsulant 16b to cover a portion of the vapor chamber 12a, portions of the electrical contacts 34 (e.g., strip leads) of the lead frame 3a, the bottom encapsulant 16b, the semiconductor die 14 and the bonding wires 15. The side surface of the top encapsulant 16a may be a slant surface and may not cover the outermost ends of the electrical contacts 34 (e.g., strip leads). That is, the outermost ends of the electrical contacts 34 (e.g., strip leads) may be exposed from the top encapsulant 16a. In addition, there may be a boundary between the top encapsulant 16a and the bottom encapsulant 16b. The central connecting element 17 (e.g., solder material such as solder bump) is disposed adjacent to the bottom surface of the bottom wall 122 of the vapor chamber 12a. The bottom portion of the central connecting element 17 is disposed in the central opening 261 of the first protection layer 26 to cover and contact the ends of the thermal vias 29. Thus, the bottom wall 122 of the vapor chamber 12a is mounted or attached to the main body 24 of the main substrate 2 through the central connecting element 17. Thus, the vapor chamber 12a of the semiconductor package structure 1a is thermally connected to the thermal vias 29 of the main substrate 2, and the heat from the vapor chamber 12a can be dissipated to the second surface 22 of the main substrate 2 through the thermal vias 29. Meanwhile, the outer connecting elements 18 (e.g., solder material such as solder bumps) are disposed adjacent to the bottom surfaces of protrusion pads 341 of the electrical contacts 34 (e.g., strip leads) of the lead frame 3a. The bottom portion of the outer connecting elements 18 (e.g., solder bumps) are disposed in the outer openings 262 of the first protection layer 26 so that the electrical contacts 34 (e.g., strip leads) of the lead frame 3a are electrically connected to the circuit layer of the main body 24 of the main substrate 2.

Figure 16:
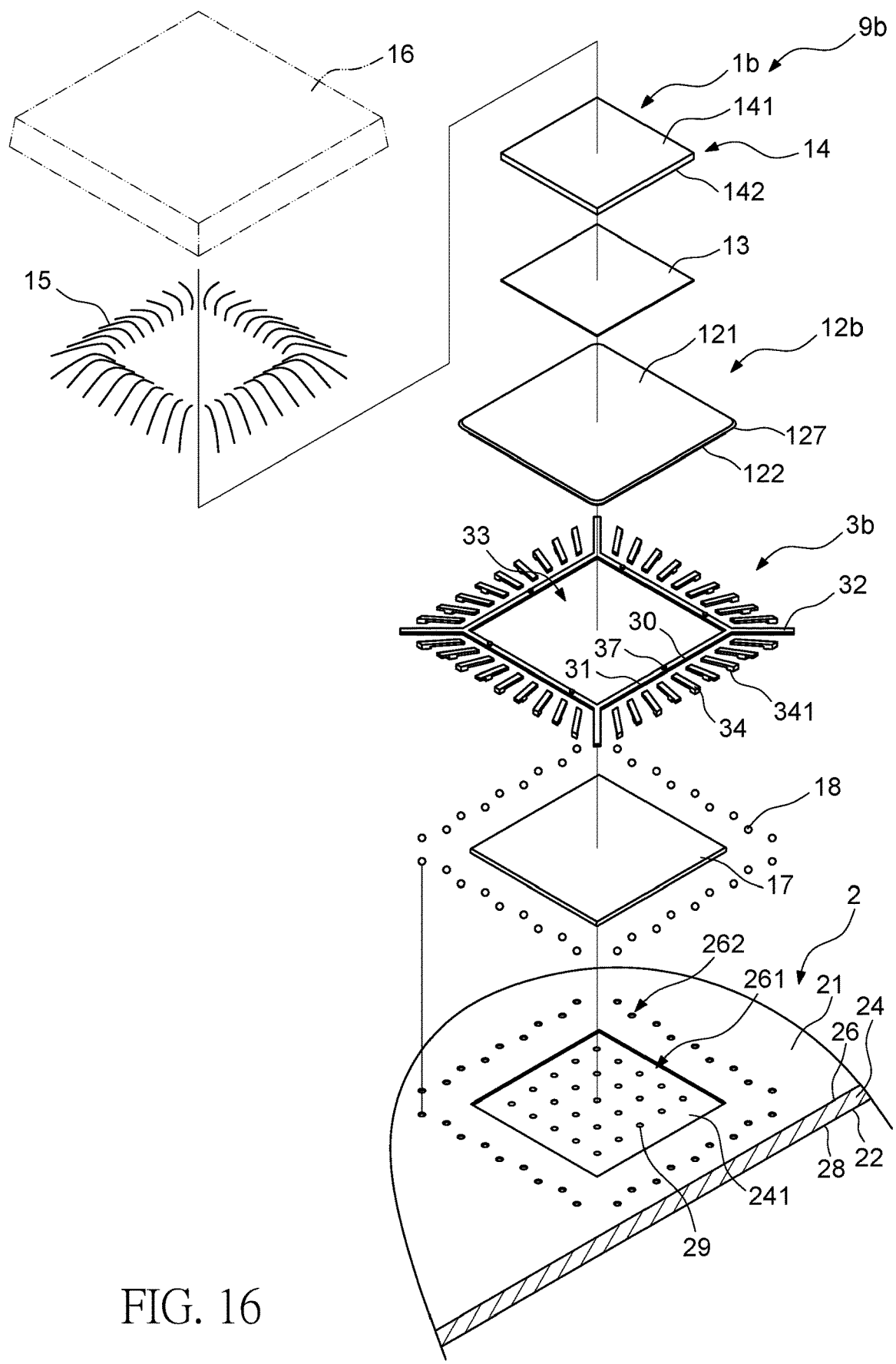
FIG. 16 illustrates an exploded perspective view of an assembly structure according to some embodiments of the present disclosure.
Figure 17:
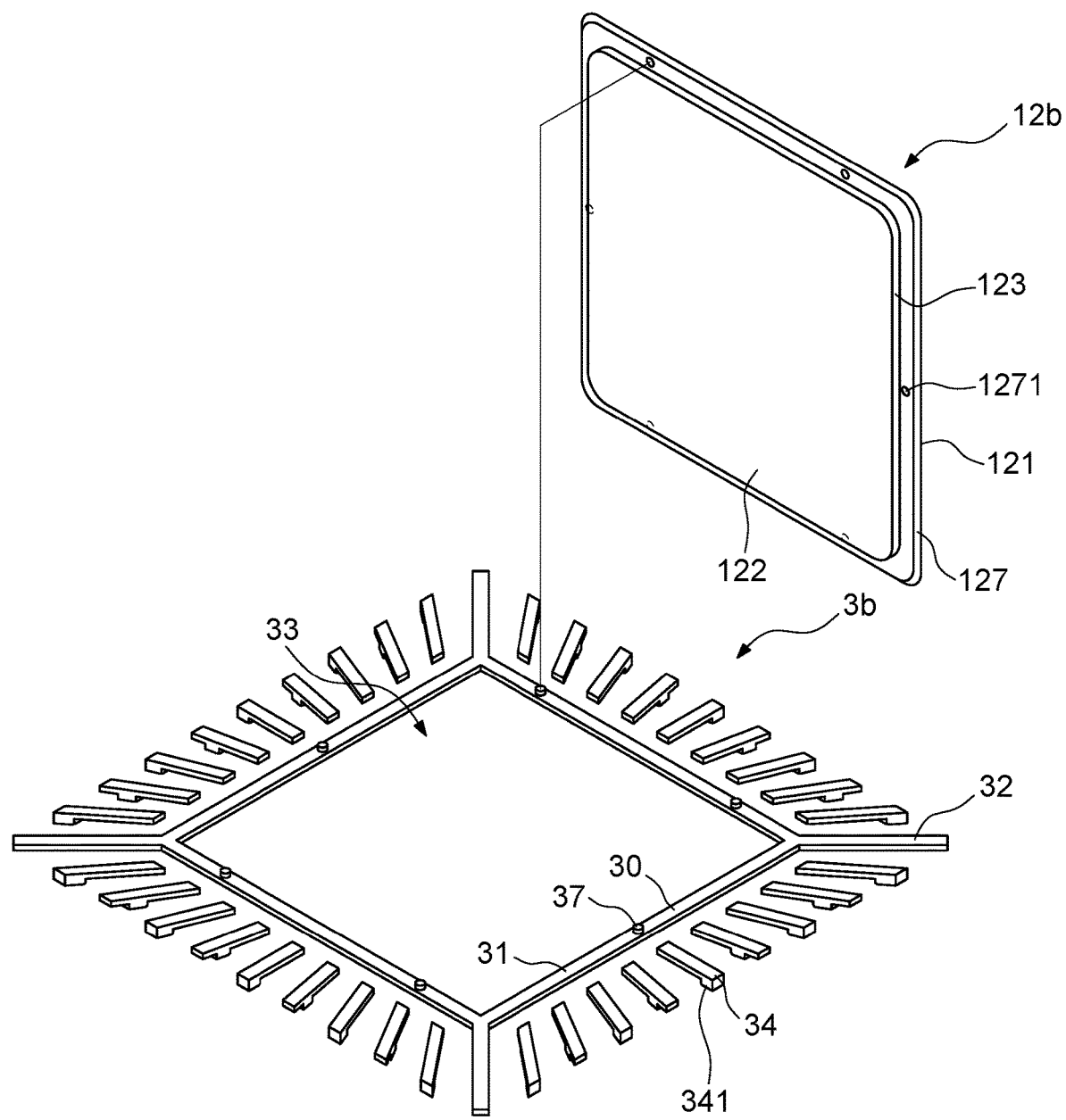
FIG. 17 illustrates perspective views of the lead frame and the vapor chamber of FIG. 16.
Figure 18:
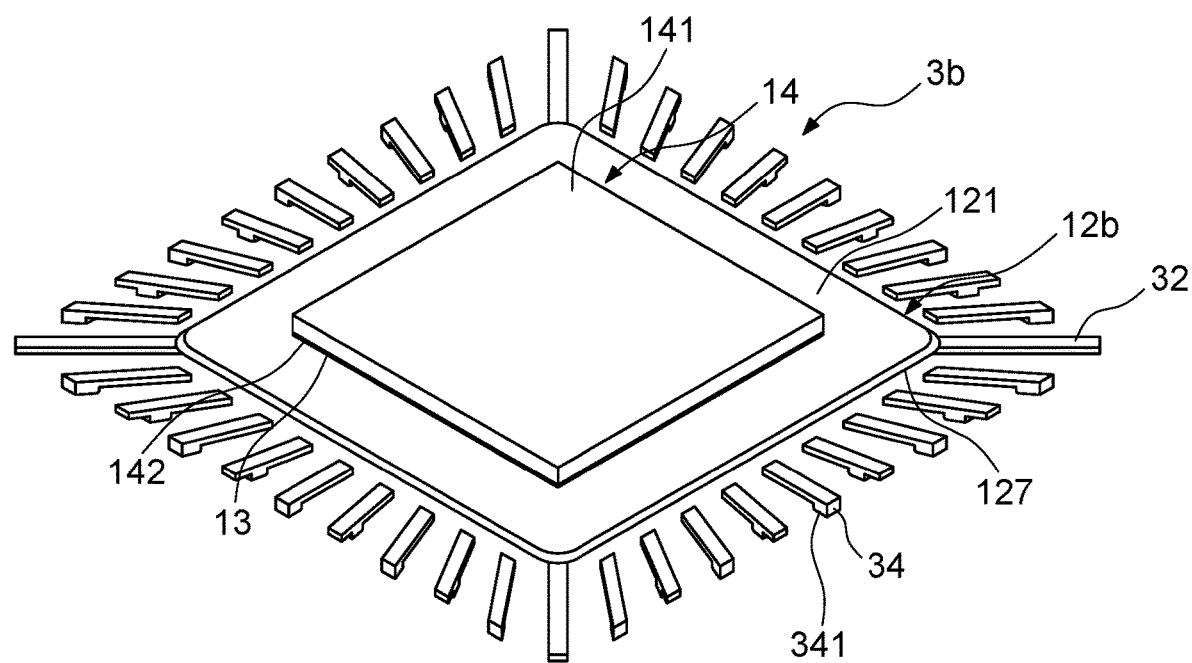
FIG. 18 illustrates an assembled top perspective view of the lead frame, the vapor chamber and the semiconductor die of FIG. 16.
Figure 19:
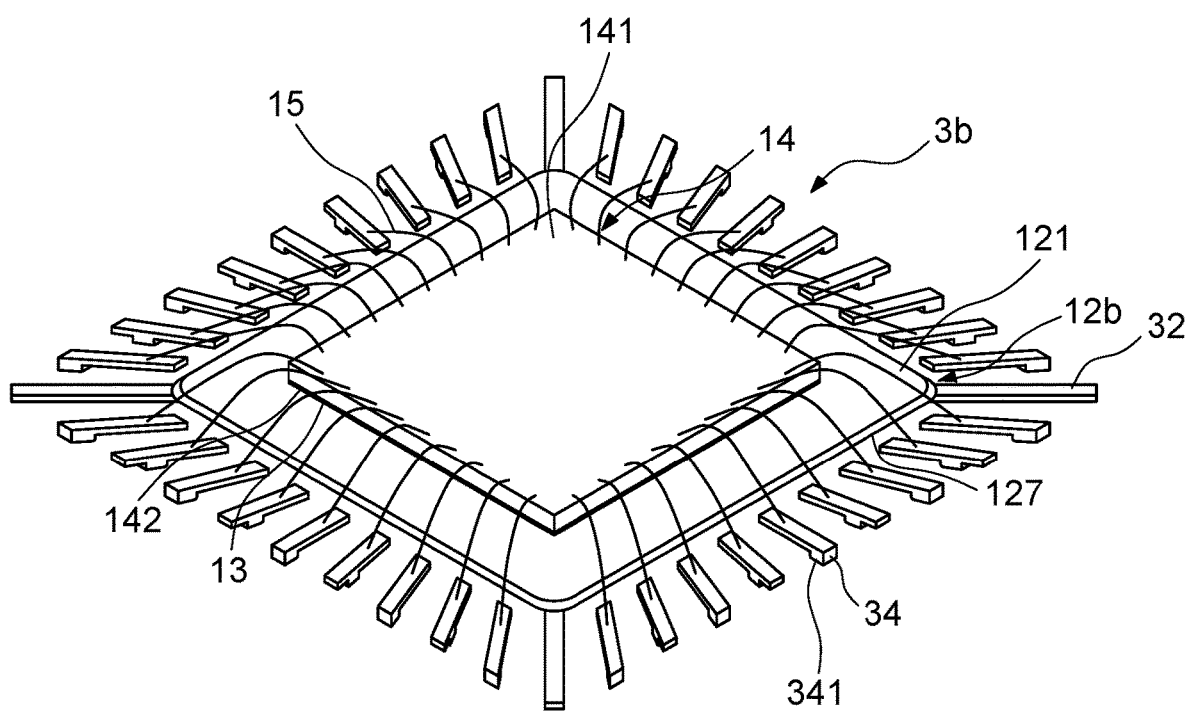
FIG. 19 illustrates an assembled top perspective view of the lead frame, the vapor chamber, the semiconductor die and the bonding wires of FIG. 16.
Figure 20:
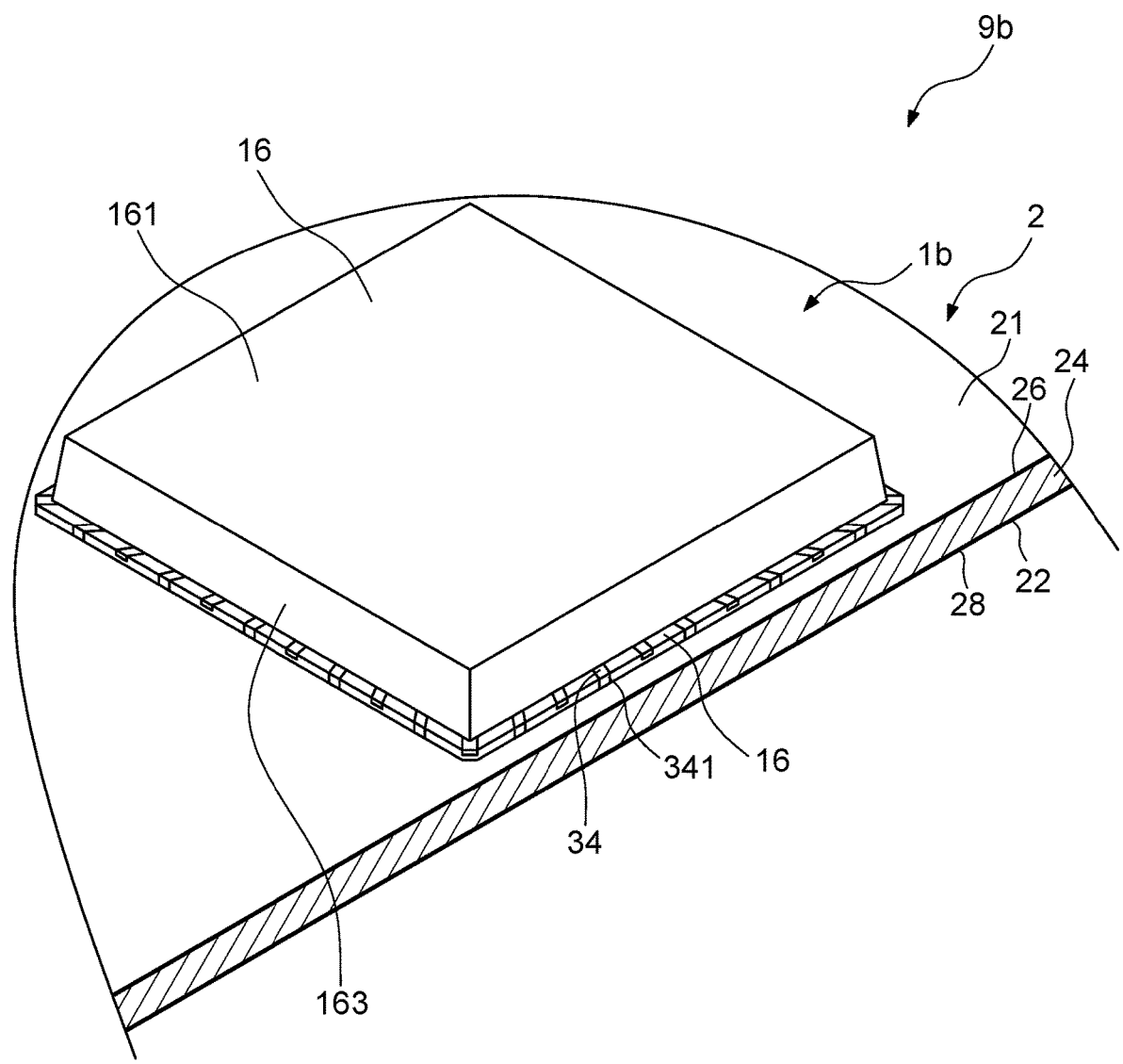
FIG. 20 illustrates an assembled perspective view of the assembly structure of FIG. 16.
Figure 21:
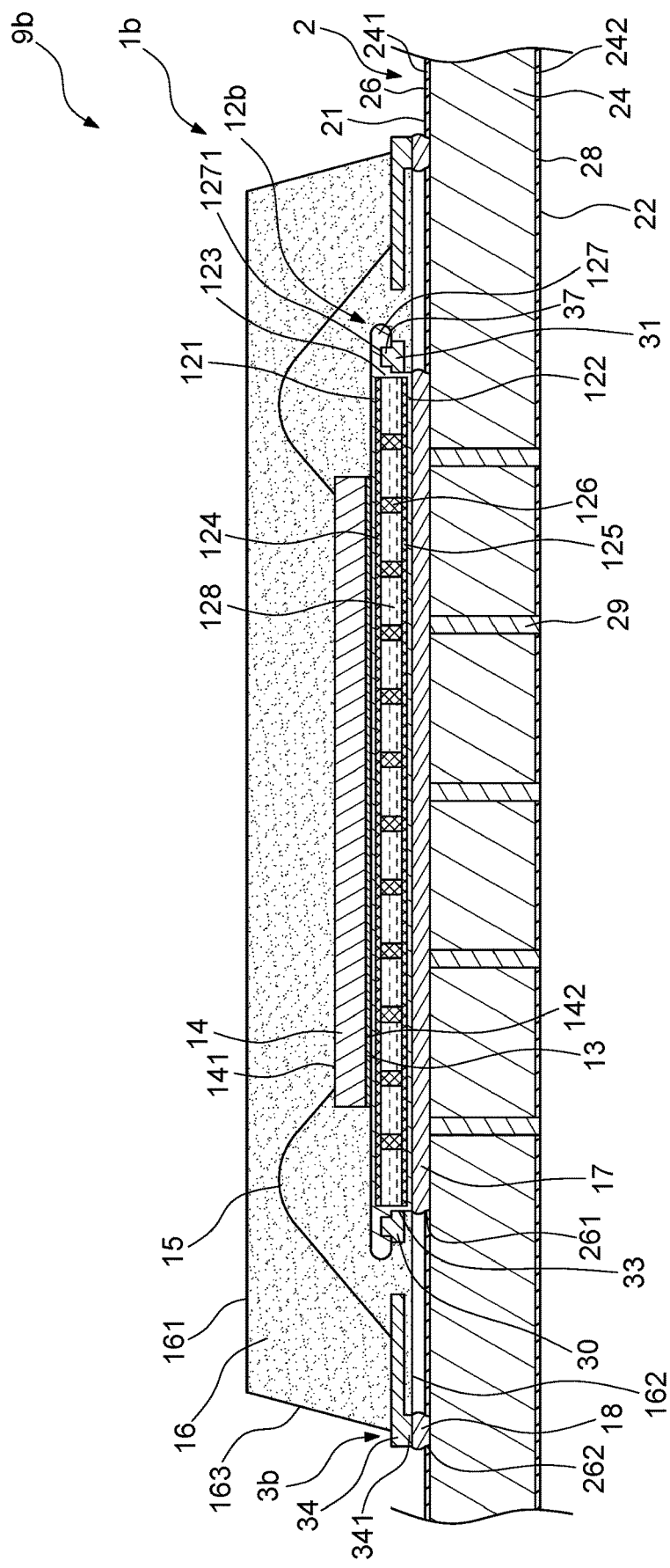
FIG. 21 illustrates a cross-sectional view of the assembly structure of FIG. 20.

FIG. 16 illustrates an exploded perspective view of an assembly structure 9b according to some embodiments of the present disclosure. FIG. 17 illustrates perspective views of the lead frame 3b and the vapor chamber 12b of FIG. 16. FIG. 18 illustrates an assembled top perspective view of the lead frame 3b, the vapor chamber 12b and the semiconductor die 14 of FIG. 16. FIG. 19 illustrates an assembled top perspective view of the lead frame 3b, the vapor chamber 12b, the semiconductor die 14 and the bonding wires 15 of FIG. 16. FIG. 20 illustrates an assembled perspective view of the assembly structure 9b of FIG. 16. FIG. 21 illustrates a cross-sectional view of the assembly structure 9b of FIG. 20. The assembly structure 9b of FIG. 16 to FIG. 21 is similar to the assembly structure 9 of FIG. 1 to FIG. 8, except for the structure of the lead frame 3b and the vapor chamber 12b of the semiconductor package structure 1b.

As shown in FIG. 17, the lead frame 3b includes a frame 30, four connecting bars 32, and a plurality of electrical contacts 34 (e.g., strip leads) surrounding the frame 30. The frame 30 may include four inner bars 31 that are connected to one another to form a ring structure and define a central opening 33. The four connecting bars 32 connect the four corners of the frame 30 and extend outwardly. The electrical contacts 34 (e.g., strip leads) are disposed around the frame 30. The electrical contacts 34 (e.g., strip leads) do not connect the frame 30 and extend outwardly. In one embodiment, a protrusion pad 341 may be further disposed on a bottom surface of an end portion of the electrical contact 34 (e.g., strip lead).

In addition, the frame 30 includes a plurality of protrusion portions 37 extending upwardly. That is, the protrusion portions 37 are disposed on the top surfaces of the inner bars 31 of the frame 30. The vapor chamber 12b may be disposed in the central opening 33 of the frame 30. The vapor chamber 12b includes a top wall 121, a bottom wall 122, a lateral wall 123, a top wick structure 124, a bottom wick structure 125, a plurality of wick bars 126, a periphery rim 127 and a working liquid 128. The top wall 121, the bottom wall 122 and the lateral wall 123 are connected or sealed together to define an enclosed chamber for accommodating the working liquid 128. The top wick structure 124 is disposed on an inner surface (e.g., bottom surface) of the top wall 121. The bottom wick structure 125 is disposed on an inner surface (e.g., top surface) of the bottom wall 122. The wick bars 126 are disposed in the enclosed chamber, and two ends of each of the wick bars 126 connect the top wall 121 and the bottom wall 122 respectively. In some embodiments, the periphery rim 127 extends horizontally outward from the lateral wall 123.

The periphery rim 127 of the vapor chamber 12b is disposed on the top surfaces of the inner bars 31 the frame 30. That is, the top surfaces of the inner bars 31 the frame 30 are used to support the periphery rim 127 of the vapor chamber 12b, and the bottom portion of the vapor chamber 12b is located within the central opening 33 of the frame 30. In addition, the vapor chamber 12b may further define a plurality of openings 1271 at the periphery rim 127. It is noted that the opening 1271 may not extend through the periphery rim 127. The amount and the position of the openings 1271 of the vapor chamber 12b correspond to the amount and the position of the protrusion portions 37 of the frame 30. Thus, after assembly, the protrusion portions 37 of the frame 30 are disposed or inserted in a respective one of the openings 1271 of the periphery rim 127 of the vapor chamber 12b, so as to prevent the shift between the vapor chamber 12b and the frame 30 of the lead frame 3b during a molding process.

As shown in FIG. 18 and FIG. 21, the semiconductor die 14 is disposed on the vapor chamber 12b. In one embodiment, the semiconductor die 14 is thermally connected and physically connected to the top wall 121 of the vapor chamber 12b through the thermal paste 13. The semiconductor die 14 has a first surface 141 and a second surface 142 opposite to the first surface 141. The second surface 142 of the semiconductor die 14 is adhered to the top wall 121 of the vapor chamber 12b through the thermal paste 13.

As shown in FIG. 19 and FIG. 21, the semiconductor die 14 is electrically connected to the electrical contacts 34 (e.g., strip leads) of the lead frame 3b through the bonding wires 15. In one embodiment, the first surface 141 of the semiconductor die 14 is electrically connected to the top surfaces of the electrical contacts 34 (e.g., strip leads) of the lead frame 3b through the bonding wires 15.

As shown in FIG. 20 and FIG. 21, the encapsulant 16 (e.g., molding compound) covers a portion of the vapor chamber 12b, portions of the electrical contacts 34 (e.g., strip leads) of the lead frame 3b, the semiconductor die 14 and the bonding wires 15. The encapsulant 16 has a top surface 161, a bottom surface 162 opposite to the top surface 161 and a side surface 163 extending between the top surface 161 and the bottom surface 162. The side surface 163 of the encapsulant 16 may be a slant surface and may not cover the outermost ends of the electrical contacts 34 (e.g., strip leads). That is, the outermost ends of the electrical contacts 34 (e.g., strip leads) may be exposed from the encapsulant 16. In addition, the bottom surfaces of the protrusion pads 341 of the electrical contacts 34 (e.g., strip leads) of the lead frame 3b and the bottom surface of the bottom wall 122 of the vapor chamber 12b may be substantially coplanar with the bottom surface 162 of the encapsulant 16. That is, the bottom surfaces of the protrusion pads 341 of the electrical contacts 34 (e.g., strip leads) of the lead frame 3b and the bottom surface of the bottom wall 122 of the vapor chamber 12b may be exposed from the bottom surface 162 of the encapsulant 16.

The central connecting element 17 (e.g., solder material such as solder bump) is disposed adjacent to the bottom surface of the bottom wall 122 of the vapor chamber 12b. The bottom portion of the central connecting element 17 is disposed in the central opening 261 of the first protection layer 26 so that the vapor chamber 12b is mounted to the main substrate 2, and the heat from the vapor chamber 12b can be dissipated to the second surface 22 of the main substrate 2 through the thermal vias 29. Meanwhile, the outer connecting elements 18 (e.g., solder bumps) are disposed adjacent to the bottom surfaces of protrusion pads 341 of the electrical contacts 34 (e.g., strip leads) of the lead frame 3b. The bottom portion of the outer connecting elements 18 (e.g., solder material such as solder bumps) are disposed in the outer openings 262 of the first protection layer 26 so that the electrical contacts 34 (e.g., strip leads) of the lead frame 3b are electrically connected to the circuit layer of the main body 24 of the main substrate 2.

Figure 22:
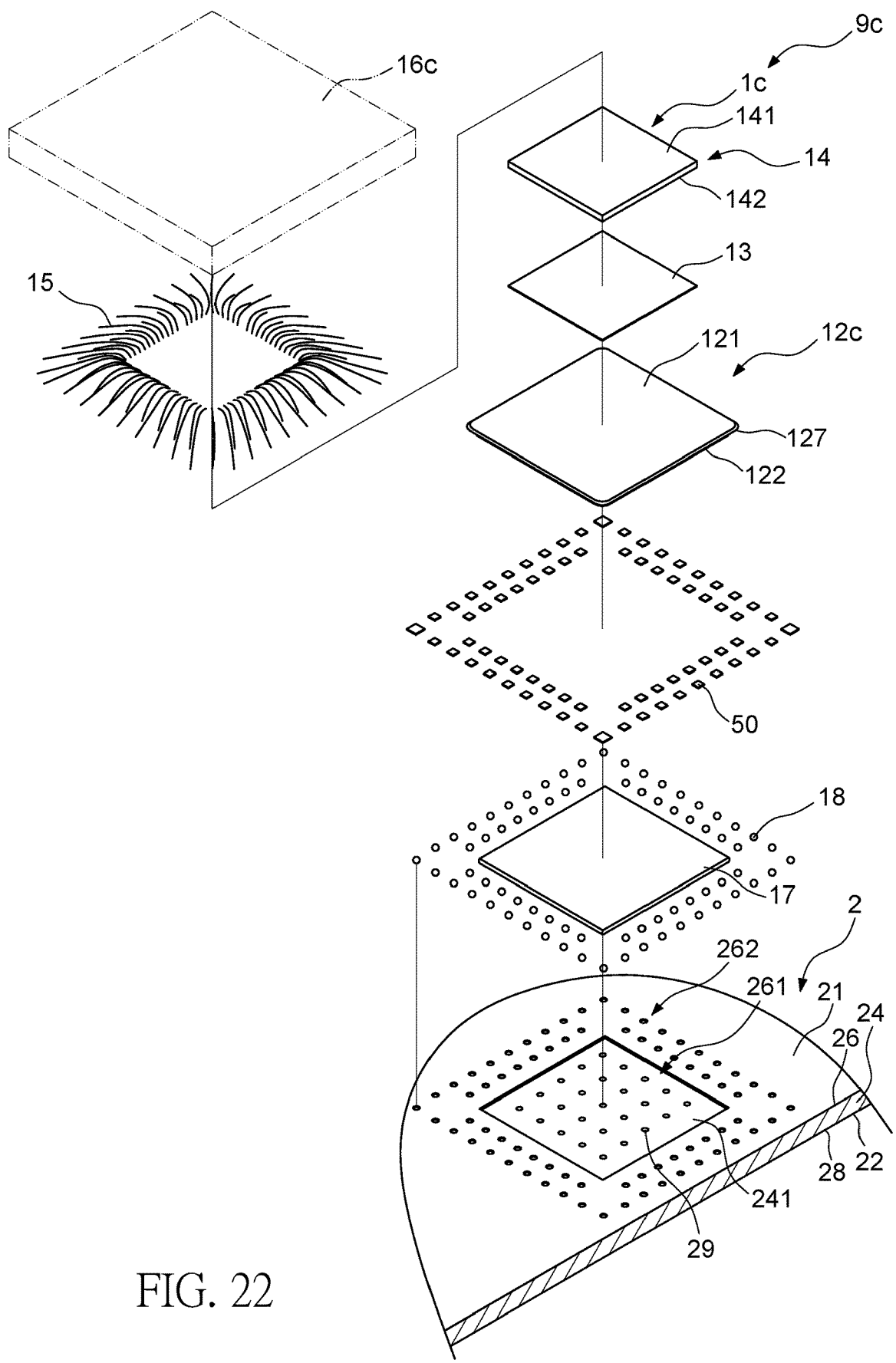
FIG. 22 illustrates an exploded perspective view of an assembly structure according to some embodiments of the present disclosure.
Figure 23:
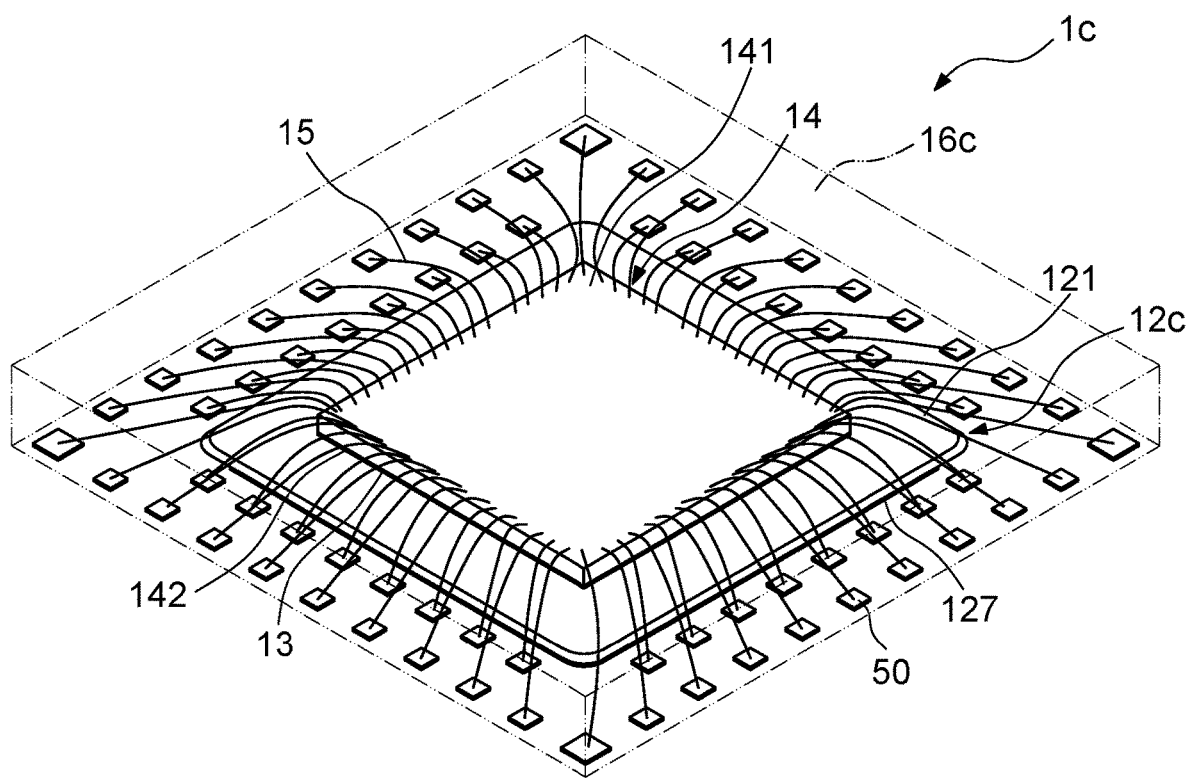
FIG. 23 illustrates an assembled top perspective view of the semiconductor package structure of the assembly structure of FIG. 22.
Figure 24:
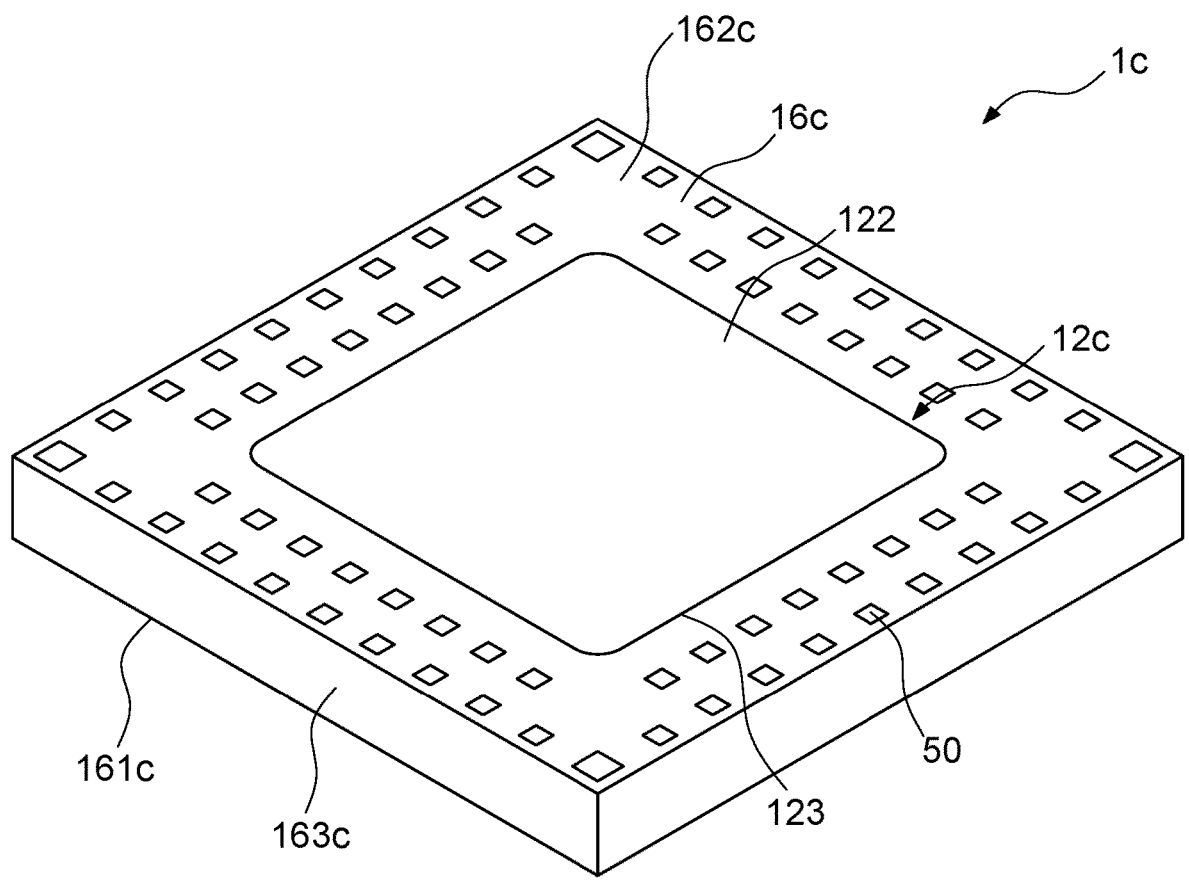
FIG. 24 illustrates a bottom perspective view of the semiconductor package structure 1*c* of FIG. 23.
Figure 25:
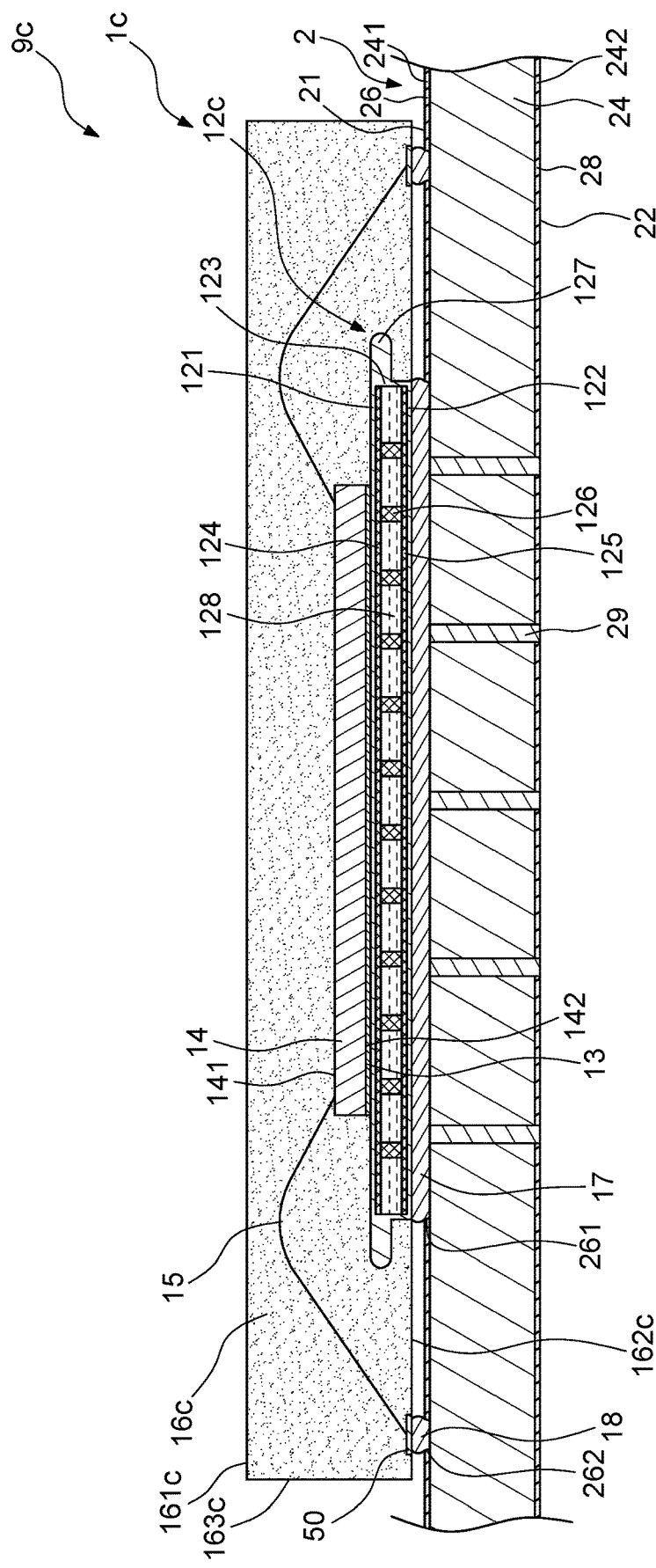
FIG. 25 illustrates an assembled cross-sectional view of the assembly structure of FIG. 22.

FIG. 22 illustrates an exploded perspective view of an assembly structure 9c according to some embodiments of the present disclosure. FIG. 23 illustrates an assembled top perspective view of the semiconductor package structure 1c of the assembly structure 9c of FIG. 22. FIG. 24 illustrates a bottom perspective view of the semiconductor package structure 1c of FIG. 23. FIG. 25 illustrates an assembled cross-sectional view of the assembly structure 9c of FIG. 22. The assembly structure 9c of FIG. 22 to FIG. 25 is similar to the assembly structure 9 of FIG. 1 to FIG. 8, and the differences are described as follows.

The semiconductor package structure 1c of the assembly structure 9c includes a plurality of electrical contacts 50 (e.g., dots), a vapor chamber 12c, a thermal paste 13, at least one semiconductor die 14, a plurality of bonding wires 15, an encapsulant 16c, a central connecting element 17 and a plurality of outer connecting elements 18.

As shown in FIG. 22, each of the electrical contacts 50 is a dot type that may be formed by plating. The electrical contacts 50 may be isolated or separated from each other. In one embodiment, each of the electrical contacts 50 (e.g., dots) may include a plurality of metal layers. For example, each of the electrical contacts 50 (e.g., dots) may include a gold layer with a thickness of about 0.03 μm to about 0.08 μm, a first palladium layer with a thickness of about 0.1 μm to about 1.0 μm, a nickel layer with a thickness of about 10 μm and a second palladium layer with a thickness of about 0.05 μm. The thickness of the vapor chamber 12c may be greater than ten times the thickness of the electrical contacts 50. For example, the thickness of the vapor chamber 12c may be greater than fifteen times, twenty times, thirty times or more times the thickness of the electrical contact 50. In one embodiment, there may be two loops of electrical contacts 50 (e.g., dots). However, in other embodiment, there may be three, four, five or more loops of electrical contacts 50 (e.g., dots).

As shown in FIG. 23, FIG. 24 and FIG. 25, the electrical contacts 50 (e.g., dots) surround the vapor chamber 12c. That is, the vapor chamber 12c is disposed in the space surrounded by the loops of the electrical contacts 50 (e.g., dots). The vapor chamber 12c includes the top wall 121, the bottom wall 122, the lateral wall 123, the top wick structure 124, the bottom wick structure 125, the wick bars 126, the periphery rim 127 and the working liquid 128. The top wall 121, the bottom wall 122 and the lateral wall 123 are connected or sealed together to define an enclosed chamber for accommodating the working liquid 128. The top wick structure 124 is disposed on an inner surface (e.g., bottom surface) of the top wall 121. The bottom wick structure 125 is disposed on an inner surface (e.g., top surface) of the bottom wall 122. The wick bars 126 are disposed in the enclosed chamber, and two ends of each of the wick bars 126 connect the top wall 121 and the bottom wall 122 respectively.

As shown in FIG. 23, the semiconductor die 14 is thermally connected and physically connected to the top wall 121 of the vapor chamber 12c through the thermal paste 13. The first surface 141 of the semiconductor die 14 is electrically connected to the electrical contacts 50 (e.g., dots) through the bonding wires 15. The encapsulant 16c (e.g., molding compound) covers a portion of the vapor chamber 12c, portions of the electrical contacts 50 (e.g., dots), the semiconductor die 14 and the bonding wires 15. The encapsulant 16c has a top surface 161c, a bottom surface 162c opposite to the top surface 161c and a side surface 163c extending between the top surface 161c and the bottom surface 162c.

As shown in FIG. 24, the bottom surfaces of the electrical contacts 50 (e.g., dots) and the bottom surface of the bottom wall 122 of the vapor chamber 12c may be substantially coplanar with the bottom surface 162c of the encapsulant 16c. That is, the bottom surfaces of the electrical contacts 50 (e.g., dots) and the bottom surface of the bottom wall 122 of the vapor chamber 12c may be exposed from the bottom surface 162c of the encapsulant 16c.

As shown in FIG. 25, the central connecting element 17 (e.g., solder material such as solder bump) is disposed adjacent to the bottom surface of the bottom wall 122 of the vapor chamber 12c. The bottom portion of the central connecting element 17 is disposed in the central opening 261 of the first protection layer 26 so that the vapor chamber 12c is mounted to the main substrate 2, and the heat from the vapor chamber 12c can be dissipated to the second surface 22 of the main substrate 2 through the thermal vias 29. Meanwhile, the outer connecting elements 18 (e.g., solder material such as solder bumps) are disposed adjacent to the bottom surfaces of electrical contacts 50 (e.g., dots). The bottom portion of the outer connecting elements 18 (e.g., solder bumps) are disposed in the outer openings 262 of the first protection layer 26 so that the electrical contacts 50 (e.g., dots) are electrically connected to the circuit layer of the main body 24 of the main substrate 2.

Figure 26:
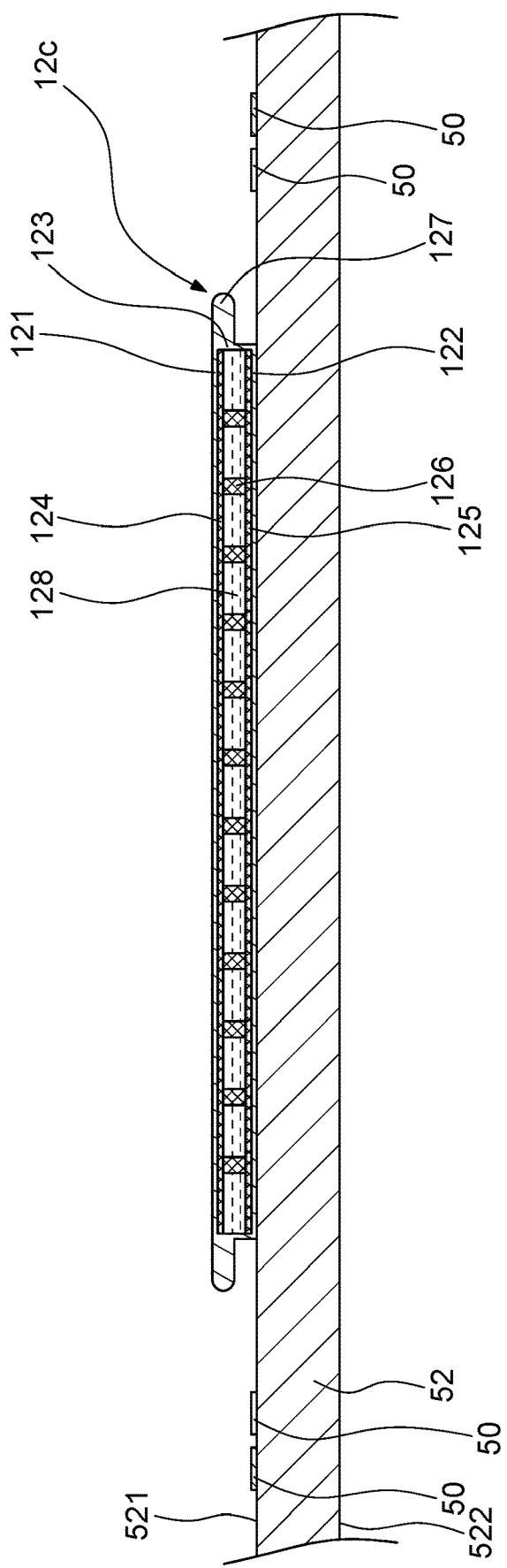
FIG. 26 illustrates one or more stages of an example of a method for manufacturing a semiconductor package structure according to some embodiments of the present disclosure.
Figure 27:
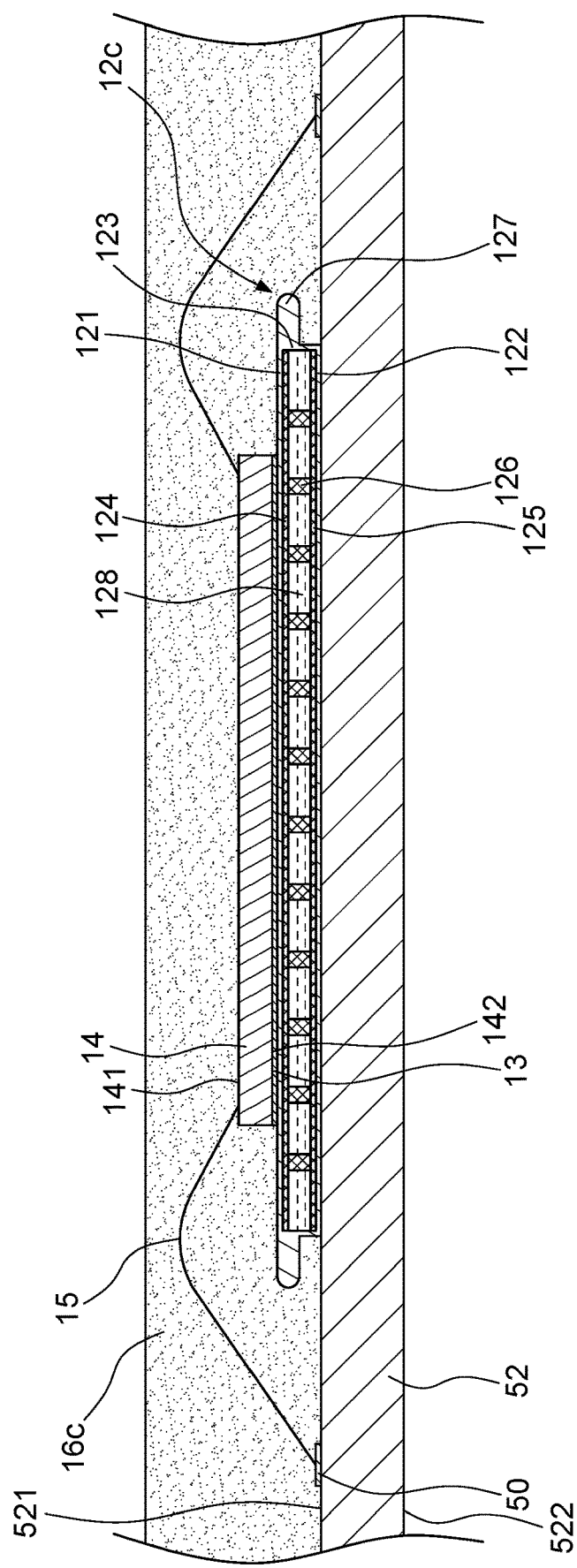
FIG. 27 illustrates one or more stages of an example of a method for manufacturing a semiconductor package structure according to some embodiments of the present disclosure.
Figure 28:
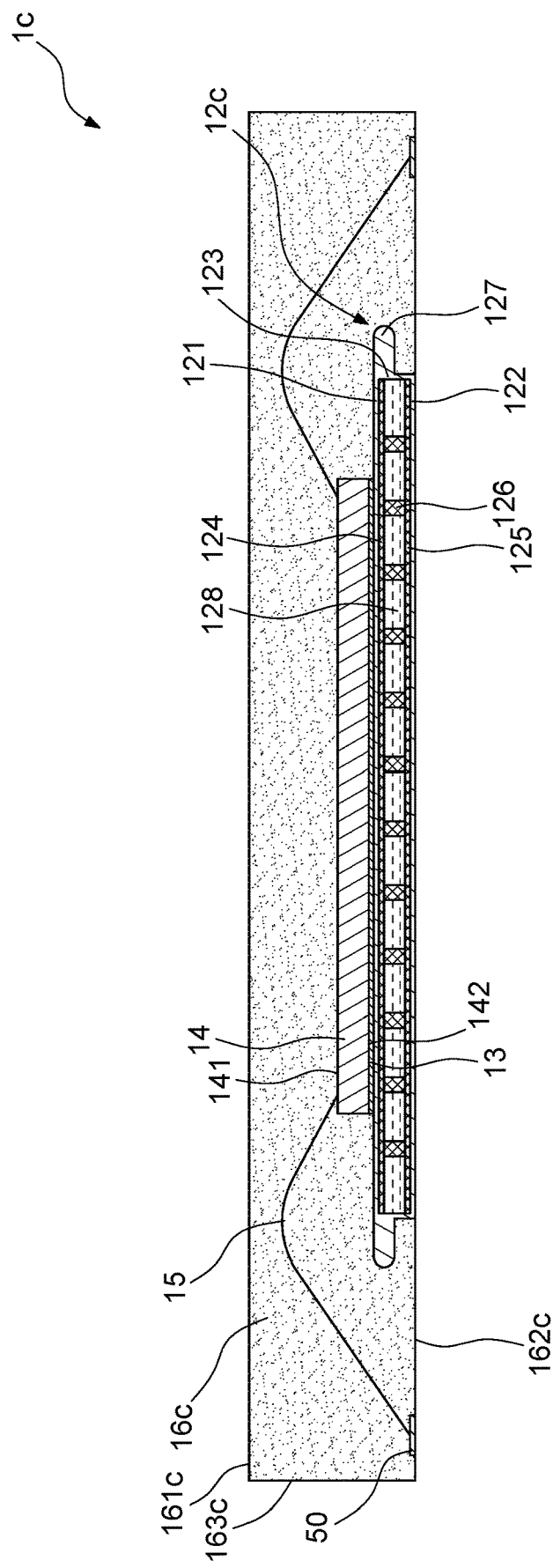
FIG. 28 illustrates one or more stages of an example of a method for manufacturing a semiconductor package structure according to some embodiments of the present disclosure.

FIG. 26 through FIG. 28 illustrate a method for manufacturing a semiconductor package structure according to some embodiments of the present disclosure. In some embodiments, the method is for manufacturing a semiconductor package structure such as the semiconductor package structure 1c shown in FIG. 22 to FIG. 25.

Referring to FIG. 26, a carrier 52 is provided. The carrier 52 has a top surface 521 and a bottom surface 522 opposite to the top surface 521. The material of the carrier 52 may be metal such as copper. Then, a plurality of electrical contacts 50 (e.g., dots) may be formed by plating on the top surface 521 of the carrier 52. The electrical contacts 50 may be isolated or separated from each other. In one embodiment, each of the electrical contacts 50 (e.g., dots) may include a plurality of metal layers. For example, each of the electrical contacts 50 (e.g., dots) may include a gold layer with a thickness of about 0.03 μm to about 0.08 μm, a first palladium layer with a thickness of about 0.1 μm to about 1.0 μm, a nickel layer with a thickness of about 10 μm and a second palladium layer with a thickness of about 0.05 μm. In one embodiment, there may be two loops of electrical contacts 50 (e.g., dots). However, in other embodiment, there may be three, four, five or more loops of electrical contacts 50 (e.g., dots).

Then, the vapor chamber 12c is disposed on the top surface 521 of the carrier 52 and in the space surrounded by the loops of the electrical contacts 50 (e.g., dots). Thus, the electrical contacts 50 (e.g., dots) surround the vapor chamber 12c. The thickness of the vapor chamber 12c may be greater than ten times the thickness of the electrical contacts 50. For example, the thickness of the vapor chamber 12c may be greater than fifteen times, twenty times, thirty times or more times the thickness of the electrical contacts 50.

As shown in FIG. 27, the first surface 141 of the semiconductor die 14 is electrically connected to the electrical contacts 50 (e.g., dots) through the bonding wires 15. Then, the encapsulant 16c (e.g., molding compound) is formed on the top surface 521 of the carrier 52 to cover a portion of the vapor chamber 12c, portions of the electrical contacts 50 (e.g., dots), the semiconductor die 14 and the bonding wires 15.

As shown in FIG. 28, the carrier 52 is removed. Then, a singulation process is conducted to form the semiconductor package structure 1c as shown in FIG. 25. The bottom surfaces of the electrical contacts 50 (e.g., dots) and the bottom surface of the bottom wall 122 of the vapor chamber 12c may be substantially coplanar with the bottom surface 162c of the encapsulant 16c. That is, the bottom surfaces of the electrical contacts 50 (e.g., dots) and the bottom surface of the bottom wall 122 of the vapor chamber 12c may be exposed from the bottom surface 162c of the encapsulant 16c.

Figure 29:
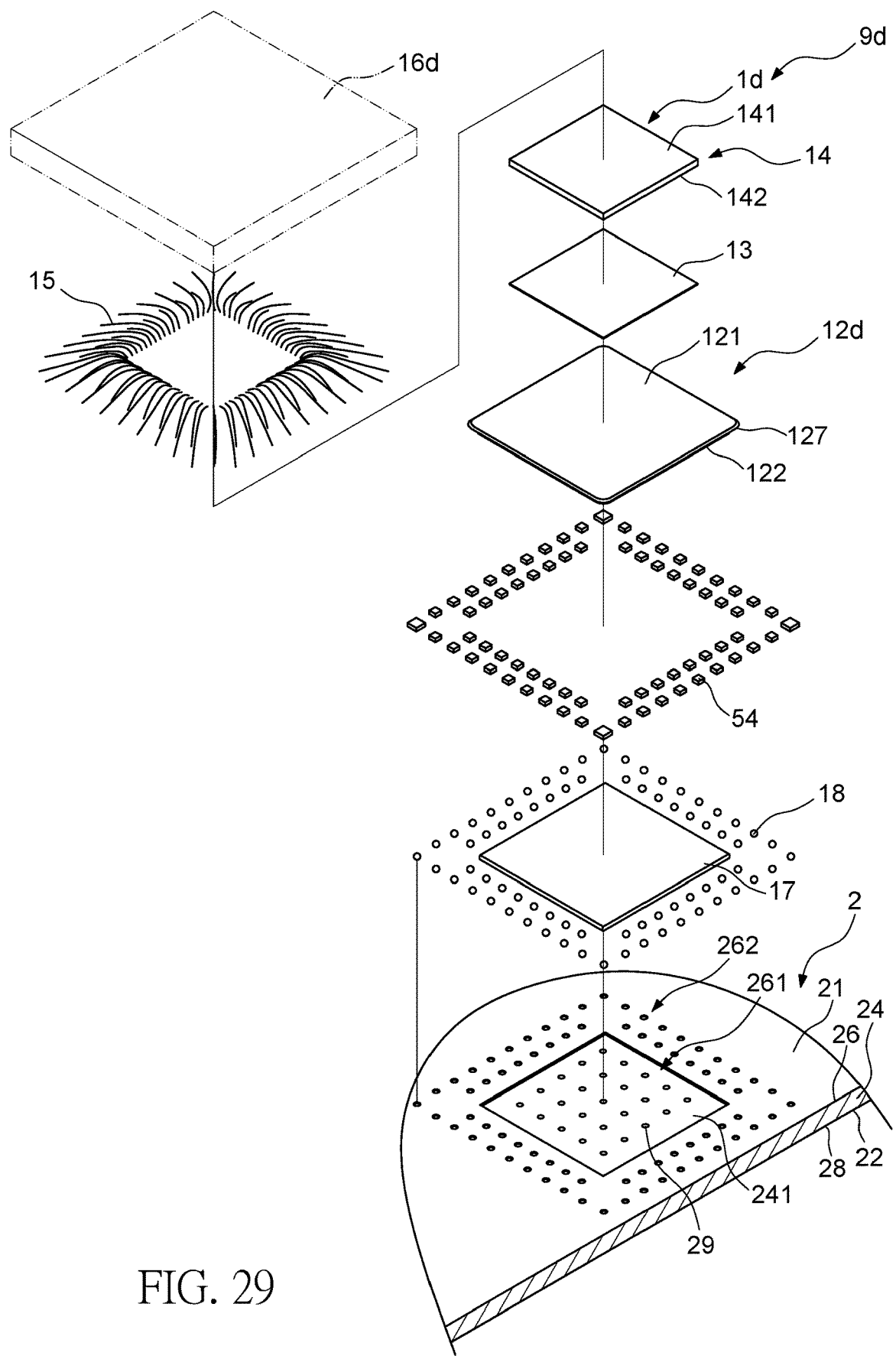
FIG. 29 illustrates an exploded perspective view of an assembly structure according to some embodiments of the present disclosure.
Figure 30:
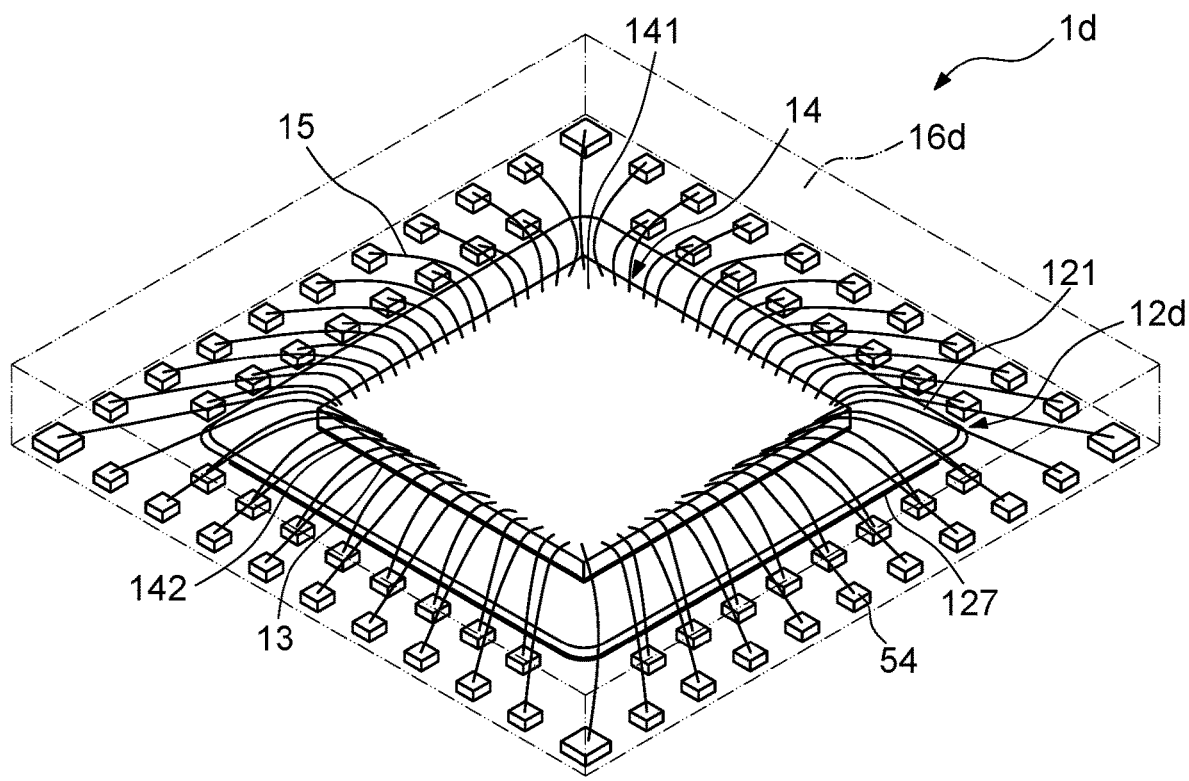
FIG. 30 illustrates an assembled top perspective view of the semiconductor package structure of the assembly structure of FIG. 29.
Figure 31:
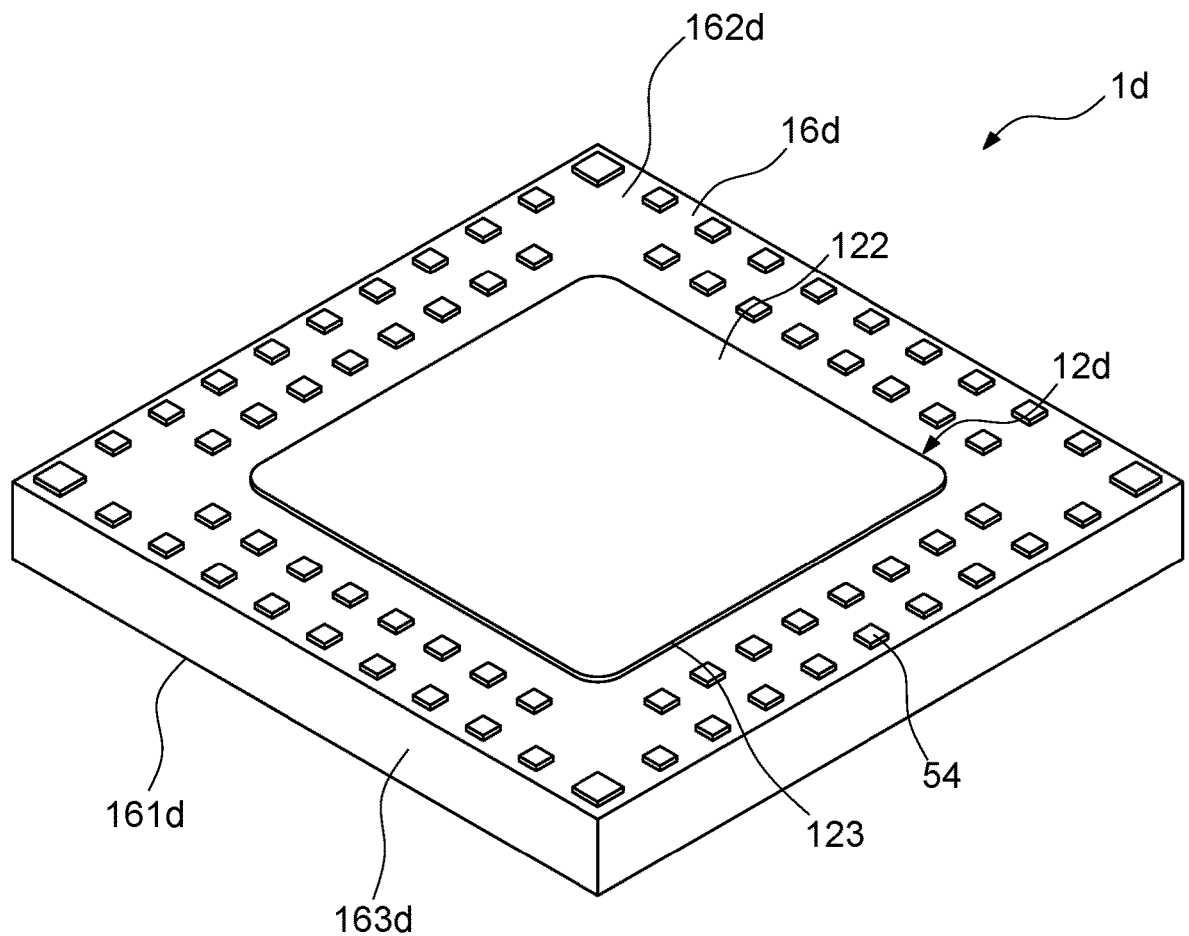
FIG. 31 illustrates a bottom perspective view of the semiconductor package structure of FIG. 30.
Figure 32:
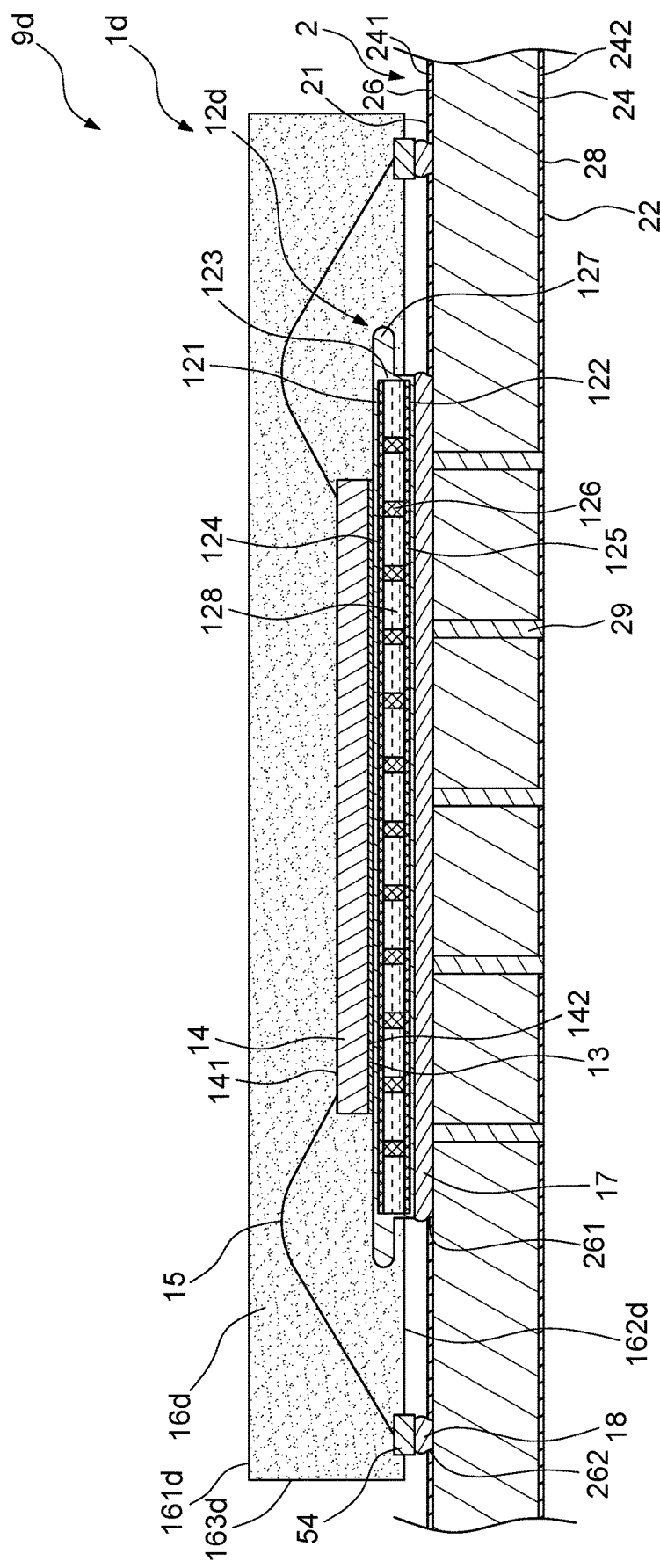
FIG. 32 illustrates an assembled cross-sectional view of the assembly structure of FIG. 29.

FIG. 29 illustrates an exploded perspective view of an assembly structure 9d according to some embodiments of the present disclosure. FIG. 30 illustrates an assembled top perspective view of the semiconductor package structure 1d of the assembly structure 9d of FIG. 29. FIG. 31 illustrates a bottom perspective view of the semiconductor package structure 1d of FIG. 30. FIG. 32 illustrates an assembled cross-sectional view of the assembly structure 9d of FIG. 29. The assembly structure 9d of FIG. 29 to FIG. 32 is similar to the assembly structure 9c of FIG. 22 to FIG. 25, and the differences are described as follows.

The semiconductor package structure 1d of the assembly structure 9d includes a plurality of electrical contacts 54 (e.g., pillar leads), a vapor chamber 12d, a thermal paste 13, at least one semiconductor die 14, a plurality of bonding wires 15, an encapsulant 16d, a central connecting element 17 and a plurality of outer connecting elements 18.

As shown in FIG. 29, each of the electrical contacts 54 is a pillar lead that may be formed by etching. The electrical contacts 54 may be isolated or separated from each other. In one embodiment, each of the electrical contacts 54 (e.g., pillar leads) may include a surface finish layer on the top surface thereof. The material of the electrical contact 54 may be copper. The surface finish layer may include a plurality of metal layers. For example, the surface finish layer may include a gold layer with a thickness of about 0.03 µm to about 0.08 µm, a first palladium layer with a thickness of about 0.1 µm to about 1.0 µm, a nickel layer with a thickness of about 10 µm and a second palladium layer with a thickness of about 0.05 µm. The thickness of the vapor chamber 12d may be less than five times the thickness of the electrical contact 54. For example, the thickness of the vapor chamber 12d may be less than four times, three times, two times or less times the thickness of the electrical contacts 54. In one embodiment, there may be two loops of electrical contacts 54 (e.g., pillar leads). However, in other embodiment, there may be three, four, five or more loops of electrical contacts 54 (e.g., pillar leads). In one embodiment, the height of the electrical contact 54 may be greater than the width of the electrical contact 54.

As shown in FIG. 30, FIG. 31 and FIG. 32, the electrical contacts 54 (e.g., pillar leads) surround the vapor chamber 12d. That is, the vapor chamber 12d is disposed in the space surrounded by the loops of the electrical contacts 54 (e.g., pillar leads). The vapor chamber 12d includes the top wall 121, the bottom wall 122, the lateral wall 123, the top wick structure 124, the bottom wick structure 125, the wick bars 126, the periphery rim 127 and the working liquid 128. The top wall 121, the bottom wall 122 and the lateral wall 123 are connected or sealed together to define an enclosed chamber for accommodating the working liquid 128. The top wick structure 124 is disposed on an inner surface (e.g., bottom surface) of the top wall 121. The bottom wick structure 125 is disposed on an inner surface (e.g., top surface) of the bottom wall 122. The wick bars 126 are disposed in the enclosed chamber, and two ends of each of the wick bars 126 connect the top wall 121 and the bottom wall 122 respectively.

As shown in FIG. 30, the semiconductor die 14 is thermally connected and physically connected to the top wall 121 of the vapor chamber 12d through the thermal paste 13. The first surface 141 of the semiconductor die 14 is electrically connected to the electrical contacts 54 (e.g., pillar leads) through the bonding wires 15. The encapsulant 16d (e.g., molding compound) covers a portion of the vapor chamber 12d, portions of the electrical contacts 54 (e.g., pillar leads), the semiconductor die 14 and the bonding wires 15. The encapsulant 16d has a top surface 161d, a bottom surface 162d opposite to the top surface 161d and a side surface 163d extending between the top surface 161d and the bottom surface 162d.

As shown in FIG. 31, the bottom surfaces of the electrical contacts 54 (e.g., pillar leads) and the bottom surface of the bottom wall 122 of the vapor chamber 12d may not be substantially coplanar with the bottom surface 162d of the encapsulant 16d. That is, the bottom surfaces of the electrical contacts 54 (e.g., pillar leads) and the bottom surface of the bottom wall 122 of the vapor chamber 12d may protrude from or are exposed from the bottom surface 162d of the encapsulant 16d.

As shown in FIG. 32, the central connecting element 17 (e.g., solder material such as solder bump) is disposed adjacent to the bottom surface of the bottom wall 122 of the vapor chamber 12d. The bottom portion of the central connecting element 17 is disposed in the central opening 261 of the first protection layer 26 so that the vapor chamber 12d is mounted to the main substrate 2, and the heat from the vapor chamber 12d can be dissipated to the second surface 22 of the main substrate 2 through the thermal vias 29. Meanwhile, the outer connecting elements 18 (e.g., solder material such as solder bumps) are disposed adjacent to the bottom surfaces of electrical contacts 54 (e.g., pillar leads). The bottom portion of the outer connecting elements 18 are disposed in the outer openings 262 of the first protection layer 26 so that the electrical contacts 54 (e.g., pillar leads) are electrically connected to the circuit layer of the main body 24 of the main substrate 2.

Figure 33:
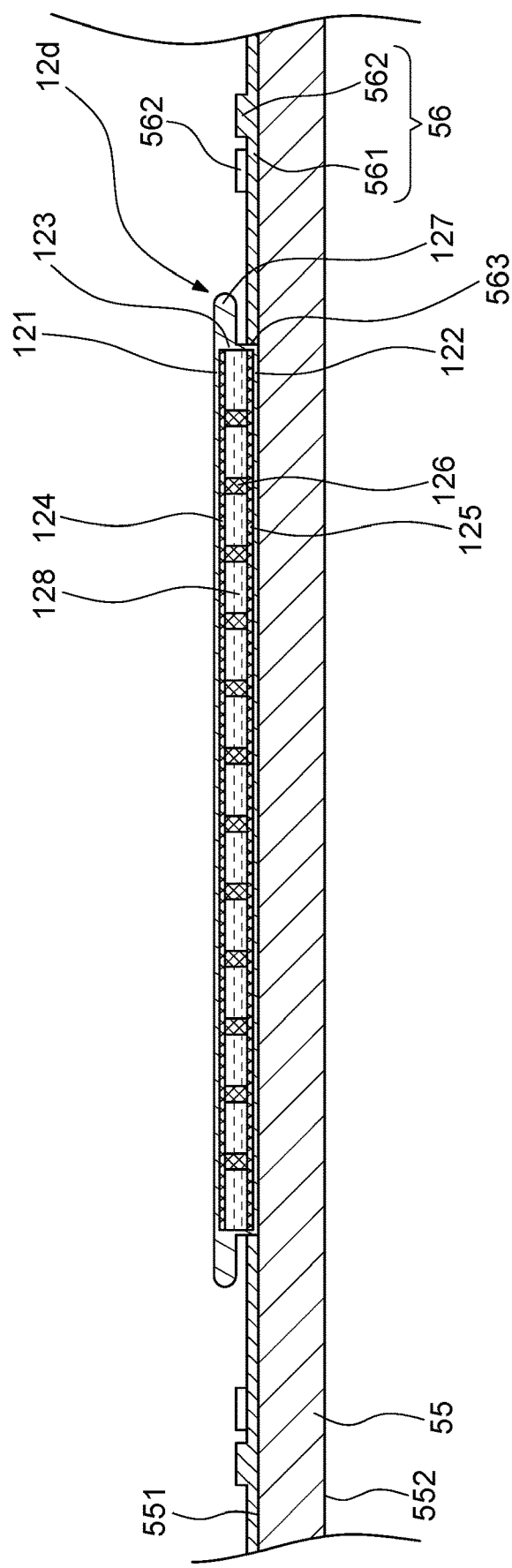
FIG. 33 illustrates one or more stages of an example of a method for manufacturing a semiconductor package structure according to some embodiments of the present disclosure.
Figure 34:
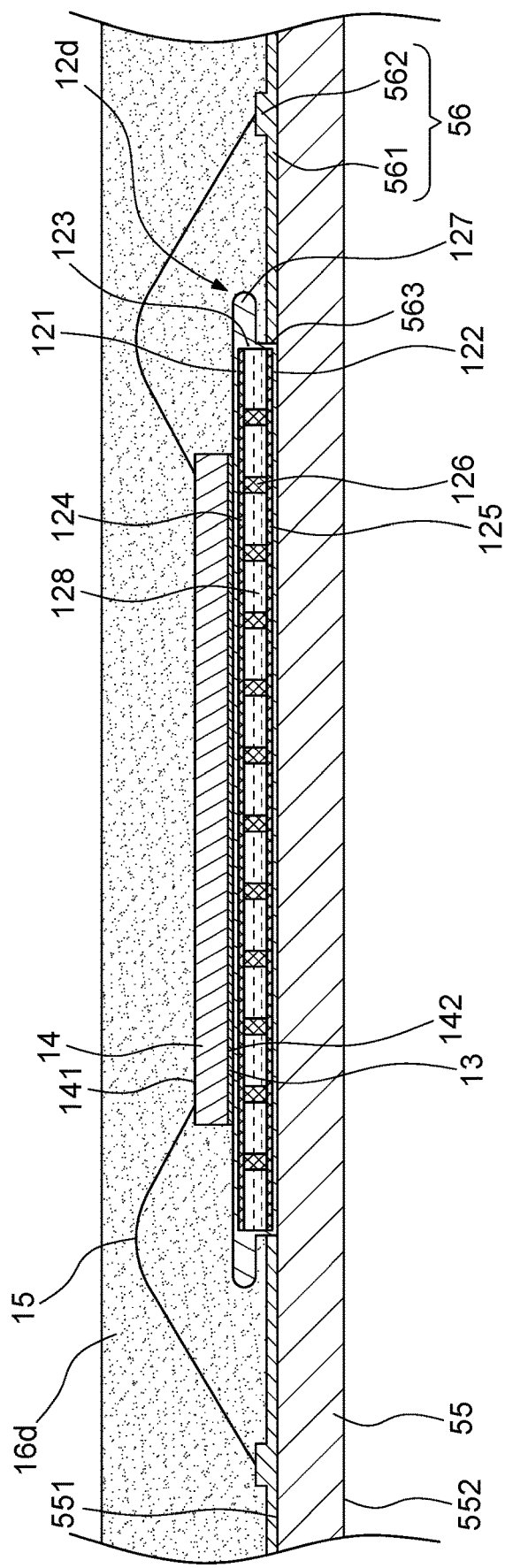
FIG. 34 illustrates one or more stages of an example of a method for manufacturing a semiconductor package structure according to some embodiments of the present disclosure.
Figure 35:
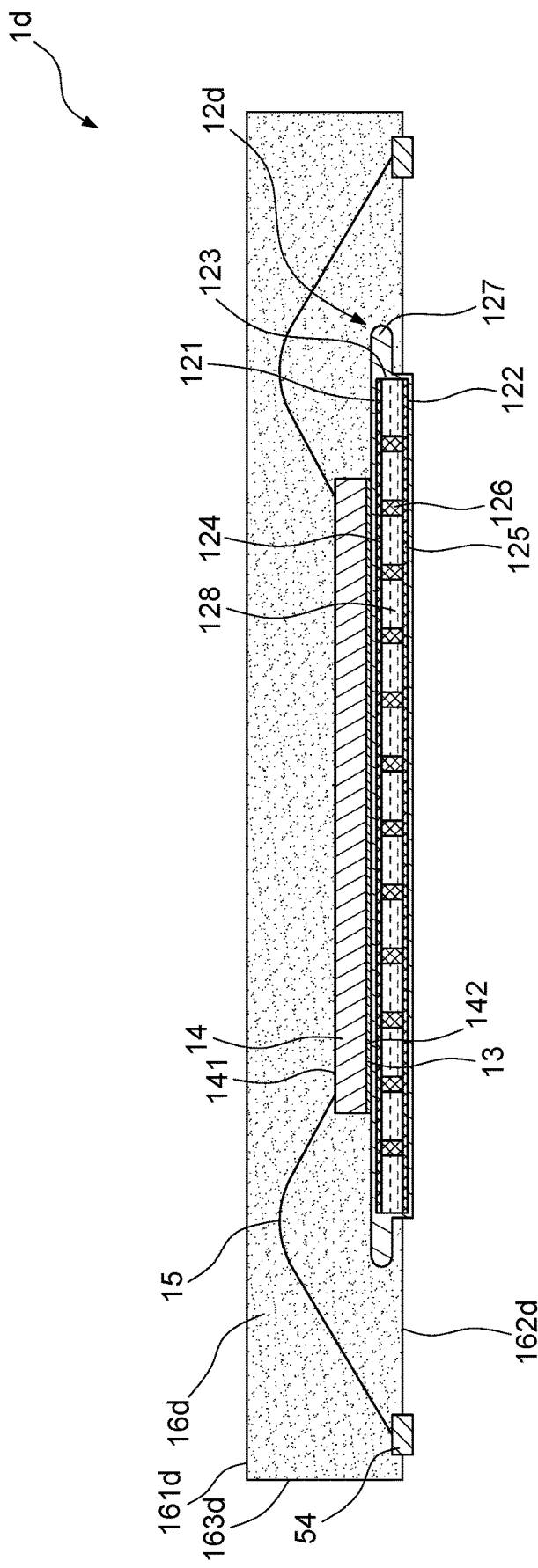
FIG. 35 illustrates one or more stages of an example of a method for manufacturing a semiconductor package structure according to some embodiments of the present disclosure.

FIG. 33 through FIG. 35 illustrate a method for manufacturing a semiconductor package structure according to some embodiments of the present disclosure. In some embodiments, the method is for manufacturing a semiconductor package structure such as the semiconductor package structure 1d shown in FIG. 29 to FIG. 32.

Referring to FIG. 33, a carrier 55 is provided. The carrier 55 has a top surface 551 and a bottom surface 552 opposite to the top surface 551. Then, a base metal 56 is formed or disposed on the top surface 551 of the carrier 55. The material of the base metal 56 may be copper. Then, a first etching process is conducted on the top surface of the base metal 56 to form a connecting plate portion 561 and a plurality of protrusion portions 562. That is, the connecting plate portion 561 and the protrusion portions 562 are formed concurrently and integrally. The protrusion portions 562 protrude from the connecting plate portion 561. In one embodiment, there may be two loops of protrusion portions 562. However, in other embodiment, there may be three, four, five or more loops of protrusion portions 562. In addition, a central portion of the connecting plate portion 561 is etched completely to define a central through hole 563 to expose a portion of the top surface 551 of the carrier 55. Then, the vapor chamber 12d is disposed on the top surface 551 of the carrier 55 and in the central through hole 563 of the connecting plate portion 561. Thus, the protrusion portions 562 surround the vapor chamber 12d.

As shown in FIG. 34, the first surface 141 of the semiconductor die 14 is electrically connected to the protrusion portions 562 through the bonding wires 15. Then, the encapsulant 16d (e.g., molding compound) is formed on the top surface of the base metal 56 to cover a portion of the vapor chamber 12d, the connecting plate portion 561, the protrusion portions 562, the semiconductor die 14 and the bonding wires 15.

As shown in FIG. 35, the carrier 55 is removed. Then, a second etching process is conducted on the bottom surface of the base metal 56 to remove the connecting plate portion 561 completely. Meanwhile, the protrusion portions 562 become the electrical contacts 54 (e.g., pillar leads) that protrude from the encapsulant 16d. The electrical contacts 54 (e.g., pillar leads) may be isolated or separated from each other. Then, a singulation process is conducted to form the semiconductor package structure 1d as shown in FIG. 32.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a vapor chamber defining an enclosed chamber for accommodating a working liquid;
   a plurality of electrical contacts surrounding the vapor chamber;
   a semiconductor die disposed on the vapor chamber, and electrically connected to the electrical contacts through a plurality of bonding wires; and
   an encapsulant covering a side surface of the vapor chamber, portions of the electrical contacts, the semiconductor die and the bonding wires,
   wherein a portion of the vapor chamber is exposed from a bottom surface of the encapsulant.

2. The semiconductor package structure of claim 1, wherein the vapor chamber includes a top wall, a bottom wall, a lateral wall, a top wick structure, a bottom wick structure, a plurality of wick bars and the working liquid, wherein the top wall, the bottom wall and the lateral wall are connected together to define the enclosed chamber, the top wick structure is disposed on an inner surface of the top wall, the bottom wick structure is disposed on an inner surface of the bottom wall, two ends of each of the wick bars connect the top wall and the bottom wall respectively.

3. The semiconductor package structure of claim 1, further comprising a frame surrounded by the electrical contacts, wherein the vapor chamber includes a periphery rim, and the periphery rim of the vapor chamber is disposed on the frame.

4. The semiconductor package structure of claim 3, wherein the frame includes a plurality of fixing pins, the vapor chamber defines a plurality of recess portions at the lateral wall, and the fixing pins of the frame are disposed in a respective one of the recess portions of the lateral wall of the vapor chamber.

5. The semiconductor package structure of claim 3, further comprising a plurality of connecting bars connecting the frame.

6. The semiconductor package structure of claim 3, wherein the frame includes a plurality of protrusion portions, the vapor chamber defines a plurality of openings at the periphery rim, and the protrusion portions of the frame are disposed in a respective one of the openings of the periphery rim of the vapor chamber.

7. The semiconductor package structure of claim 1, wherein the electrical contacts are strip leads.

8. The semiconductor package structure of claim 1, wherein the electrical contacts are dots.

9. The semiconductor package structure of claim 8, wherein bottom surfaces of the electrical contacts are substantially coplanar with a bottom surface of the encapsulant.

10. The semiconductor package structure of claim 1, wherein the electrical contacts are pillar leads.

11. The semiconductor package structure of claim 10, wherein bottom portions of the electrical contacts protrude a bottom surface of the encapsulant.

12. The semiconductor package structure of claim 1, wherein the semiconductor die is physically connected to a top surface the vapor chamber.

13. The semiconductor package structure of claim 1, wherein the encapsulant includes a top encapsulant and a bottom encapsulant, the bottom encapsulant covers a portion of the vapor chamber and portions of the electrical contacts, and the top encapsulant covers the semiconductor die and the bonding wires.

14. The semiconductor package structure of claim 13, wherein top surfaces of the electrical contacts are substantially coplanar with a top surface of the bottom encapsulant, a top surface of the vapor chamber protrudes from the top surface of the bottom encapsulant.

15. An assembly structure, comprising:
a main substrate; and
a semiconductor package structure thermally connected to the main substrate, and comprising:
a vapor chamber;
a semiconductor die thermally connected to the vapor chamber; and
an encapsulant covering a portion of the vapor chamber and the semiconductor die, wherein the vapor chamber is disposed between the semiconductor die and the main substrate and forms a heat transfer path from the semiconductor die to the main substrate, wherein a portion of the vapor chamber is exposed from a bottom surface of the encapsulant and thermally connected to the main substrate.

16. The assembly structure of claim 15, wherein the main substrate includes a plurality of thermal vias extending through the main substrate, and the semiconductor package structure is thermally connected to the thermal vias of the main substrate.

17. The assembly structure of claim 15, wherein the vapor chamber defines an enclosed chamber for accommodating a working liquid.

18. The assembly structure of claim 15, wherein the semiconductor package structure further comprises a plurality of electrical contacts surrounding the vapor chamber and embedded in the encapsulant, the semiconductor die is electrically connected to the electrical contacts through a plurality of bonding wires, and portions of the electrical contacts are exposed from a bottom surface of the encapsulant and electrically connected to the main substrate.

19. The assembly structure of claim 15, wherein the vapor chamber is attached to the main substrate through a solder material.

20. The semiconductor package structure of claim 1, wherein the encapsulant further covers a top surface of the vapor chamber.

* * * * *